United States Patent
Lee et al.

(10) Patent No.: US 10,557,596 B2
(45) Date of Patent: Feb. 11, 2020

(54) LIGHT EMITTING DEVICE PACKAGE HAVING A BLACK EPOXY MOLDING COMPOUND (EMC) BODY AND LIGHTING APPARATUS INCLUDING THE SAME

(71) Applicant: LG INNOTEK CO., LTD., Seoul (KR)

(72) Inventors: Dong Won Lee, Seoul (KR); Sung Ho Park, Seoul (KR); Min Kyu Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/077,360

(22) PCT Filed: Feb. 10, 2017

(86) PCT No.: PCT/KR2017/001498
§ 371 (c)(1),
(2) Date: Aug. 10, 2018

(87) PCT Pub. No.: WO2017/138779
PCT Pub. Date: Aug. 17, 2017

(65) Prior Publication Data
US 2019/0086039 A1   Mar. 21, 2019

(30) Foreign Application Priority Data

Feb. 12, 2016 (KR) .................. 10-2016-0016104
Feb. 24, 2016 (KR) .................. 10-2016-0021779

(51) Int. Cl.
| | | |
|---|---|---|
| H01L 33/36 | (2010.01) | |
| H01L 33/40 | (2010.01) | |
| H01L 33/42 | (2010.01) | |
| H01L 33/48 | (2010.01) | |
| H01L 33/52 | (2010.01) | |
| H01L 33/56 | (2010.01) | |
| H01L 33/62 | (2010.01) | |
| F21K 9/90 | (2016.01) | |

(Continued)

(52) U.S. Cl.
CPC .................. *F21K 9/90* (2013.01); *F21K 9/00* (2013.01); *F21S 2/00* (2013.01); *F21S 2/005* (2013.01);

(Continued)

(58) Field of Classification Search
CPC ....... H01L 33/36; H01L 33/405; H01L 33/42; H01L 33/48; H01L 33/52; H01L 33/56;

(Continued)

(56) References Cited

U.S. PATENT DOCUMENTS 4,916,464 A * 4/1990 Ito .............................. B41J 2/45
                                                              347/237
5,416,871 A * 5/1995 Takahashi .............. H04B 10/25
                                                              385/14

(Continued)

FOREIGN PATENT DOCUMENTS

| EP | 2 330 645 A2 | 6/2011 |
| EP | 2 784 833 A1 | 10/2014 |

(Continued)

*Primary Examiner* — Ida M Soward
(74) *Attorney, Agent, or Firm* — Birch, Stewart, Kolasch & Birch, LLP

(57) ABSTRACT

A light emitting device of an embodiment includes a body including a black epoxy molding compound (EMC) including carbon black; first and second lead frames electrically separated from each other by the body; a light emitting device disposed above at least one of the first or second lead frame; and a molding member disposed above the body and the first and second lead frames so as to surround the light emitting device.

20 Claims, 21 Drawing Sheets

(51) Int. Cl.
*F21K 9/00* (2016.01)
*F21S 2/00* (2016.01)
*H01L 23/00* (2006.01)

(52) U.S. Cl.
CPC ............ *H01L 33/36* (2013.01); *H01L 33/405* (2013.01); *H01L 33/42* (2013.01); *H01L 33/48* (2013.01); *H01L 33/52* (2013.01); *H01L 33/56* (2013.01); *H01L 33/62* (2013.01); *H01L 24/48* (2013.01); *H01L 2224/48247* (2013.01); *H01L 2224/48471* (2013.01)

(58) Field of Classification Search
CPC .... H01L 33/62; F21K 9/90; F21K 9/00; F21S 2/00; F21S 2/005
See application file for complete search history.

(56) References Cited

U.S. PATENT DOCUMENTS

| | | | |
|---|---|---|---|
| 5,951,152 A * | 9/1999 | Zabawski | G02B 6/0006 313/318.06 |
| 6,116,946 A * | 9/2000 | Lewis | H01R 13/6633 439/490 |
| 6,349,105 B1 * | 2/2002 | Gilliland | H01S 5/02208 372/50.1 |
| 9,733,357 B2 * | 8/2017 | Costello | G01S 7/4813 |
| 10,217,918 B2 * | 2/2019 | Lee | H01L 33/50 |
| 2004/0065894 A1 | 4/2004 | Hashimoto et al. | |
| 2004/0188700 A1 | 9/2004 | Fukasawa et al. | |
| 2011/0054072 A1 | 3/2011 | Sawada et al. | |
| 2012/0080674 A1 | 4/2012 | Shimizu et al. | |
| 2015/0330772 A1 * | 11/2015 | Charusabha | H05K 3/284 250/353 |
| 2018/0226552 A1 * | 8/2018 | Lee | H01L 33/50 |

FOREIGN PATENT DOCUMENTS

| | | |
|---|---|---|
| EP | 2 966 696 A1 | 1/2016 |
| JP | 2007-073575 A | 3/2007 |
| JP | 2011-074359 A | 4/2011 |
| JP | 2011-151069 A | 8/2011 |
| JP | 2013-077794 A | 4/2013 |
| JP | 2014-225675 A | 12/2014 |
| KR | 10-2013-0123088 A | 11/2013 |
| KR | 10-2015-0109590 A | 10/2015 |
| KR | 10-2015-0127433 A | 11/2015 |

* cited by examiner

【FIG. 1】
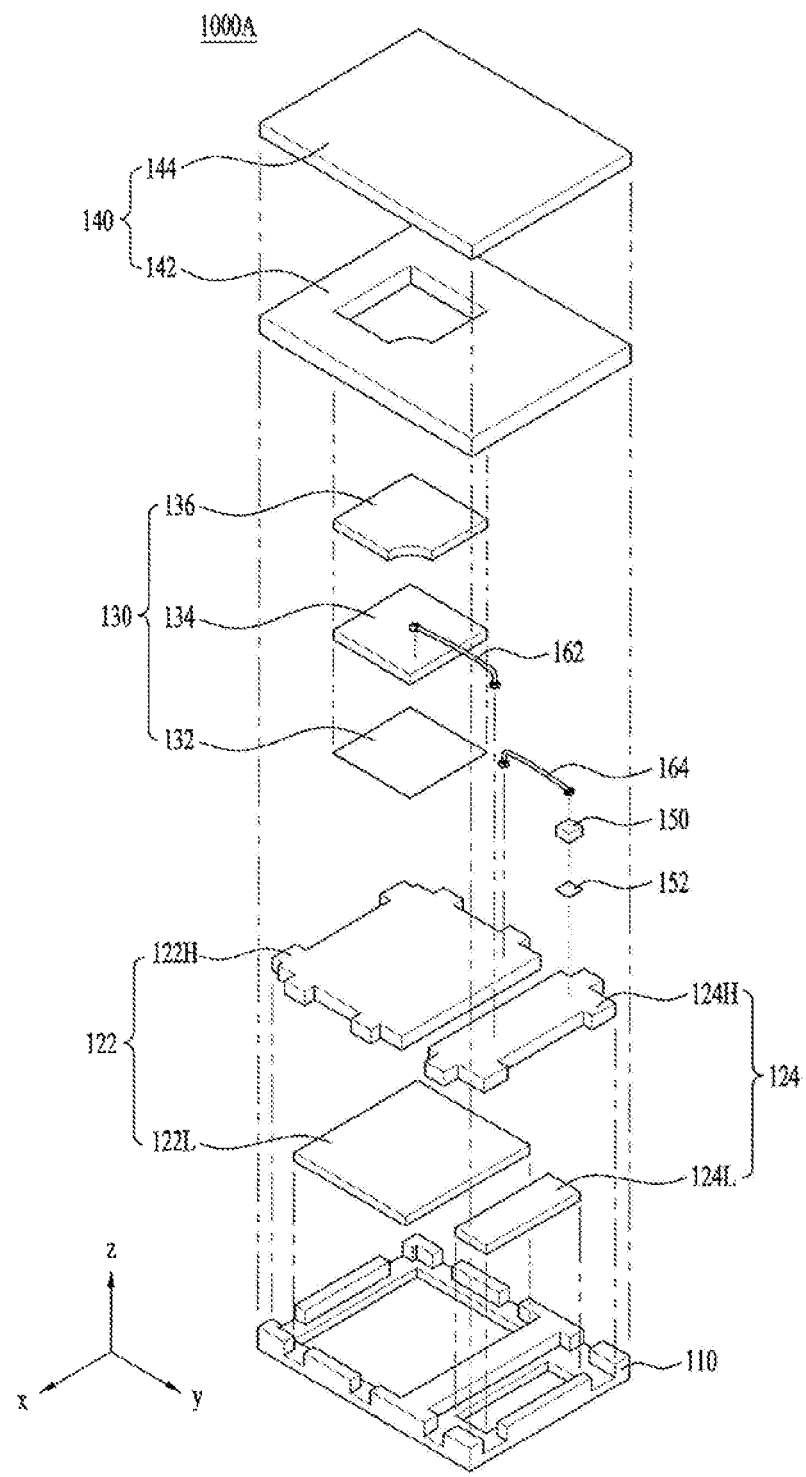

[FIG. 2]
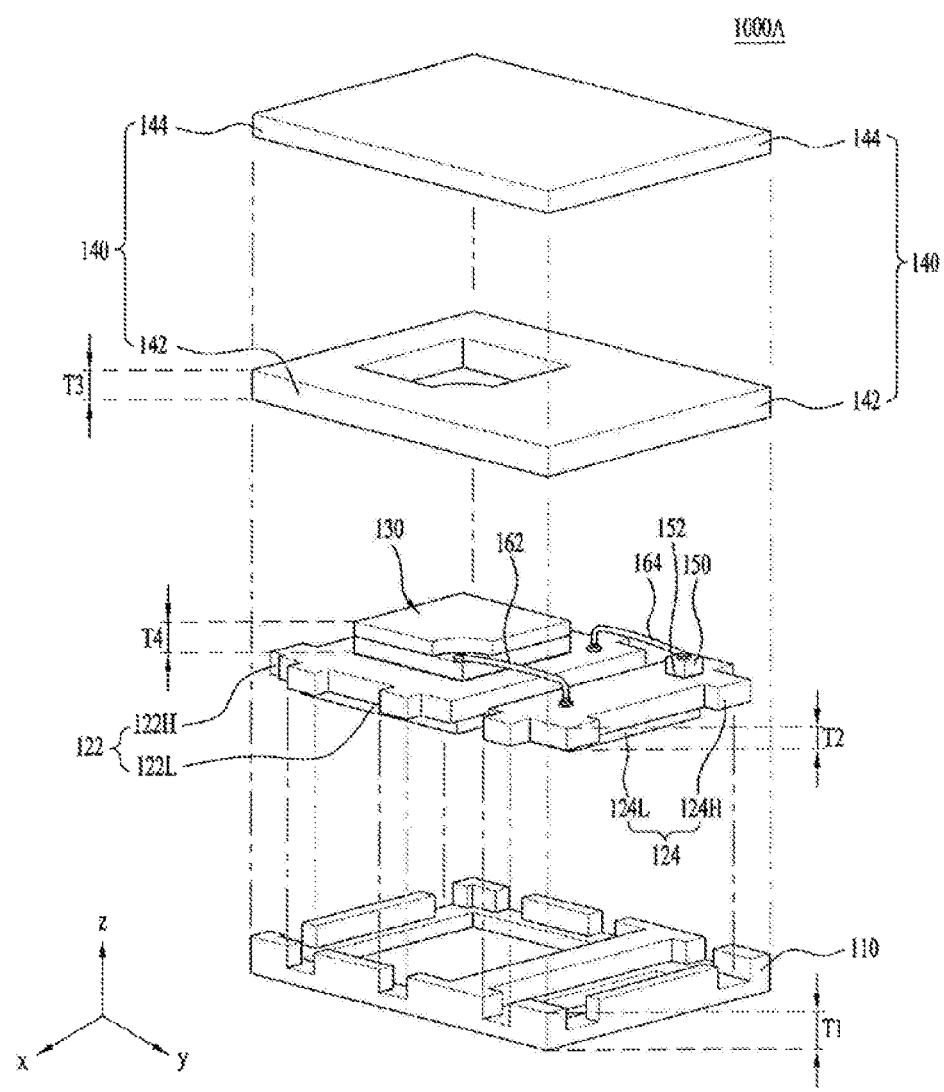

[FIG. 3]
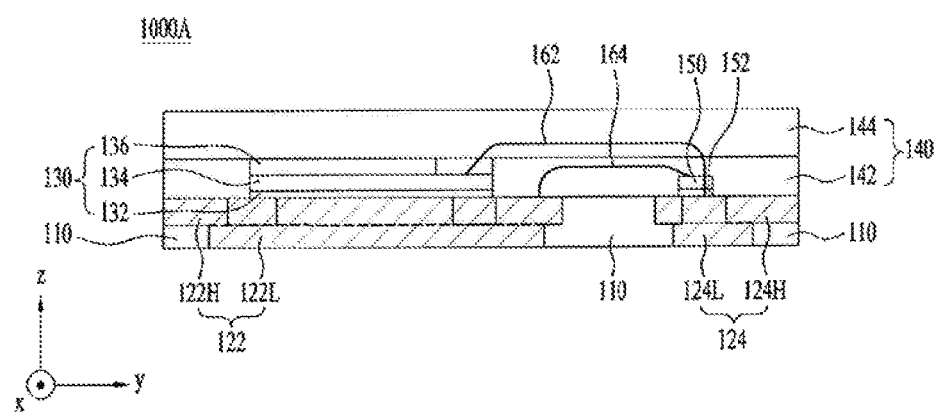

[FIG. 4]
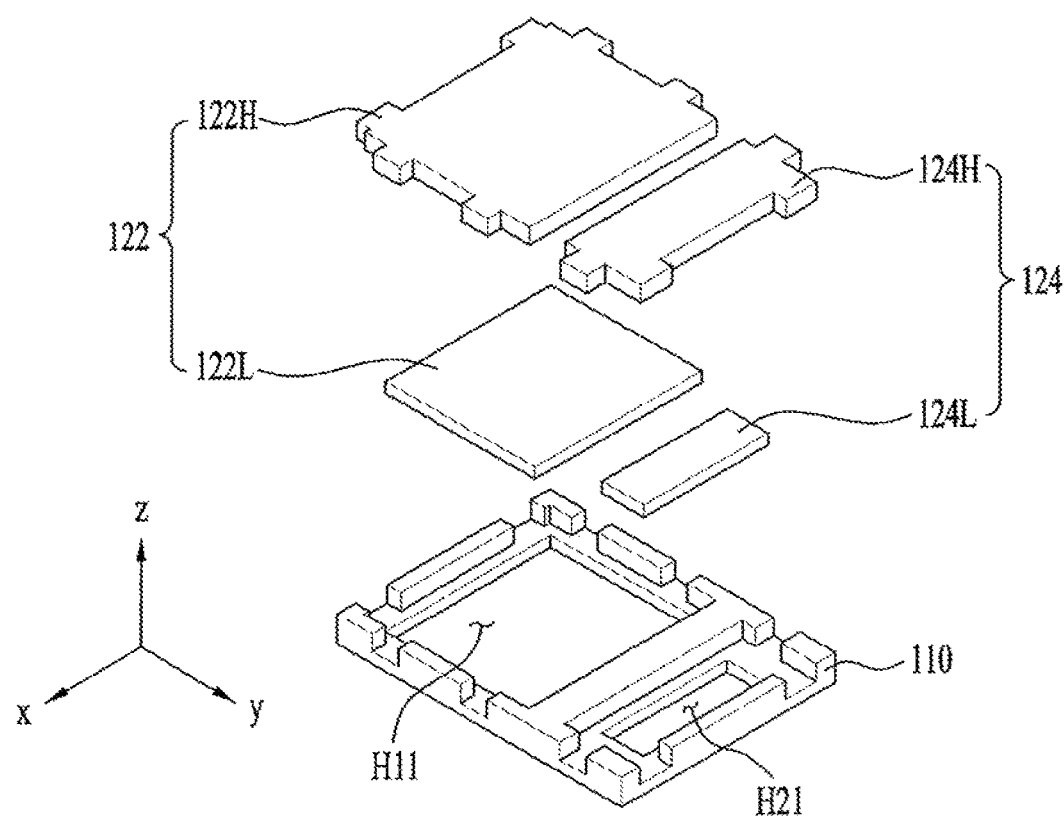

[FIG. 5]
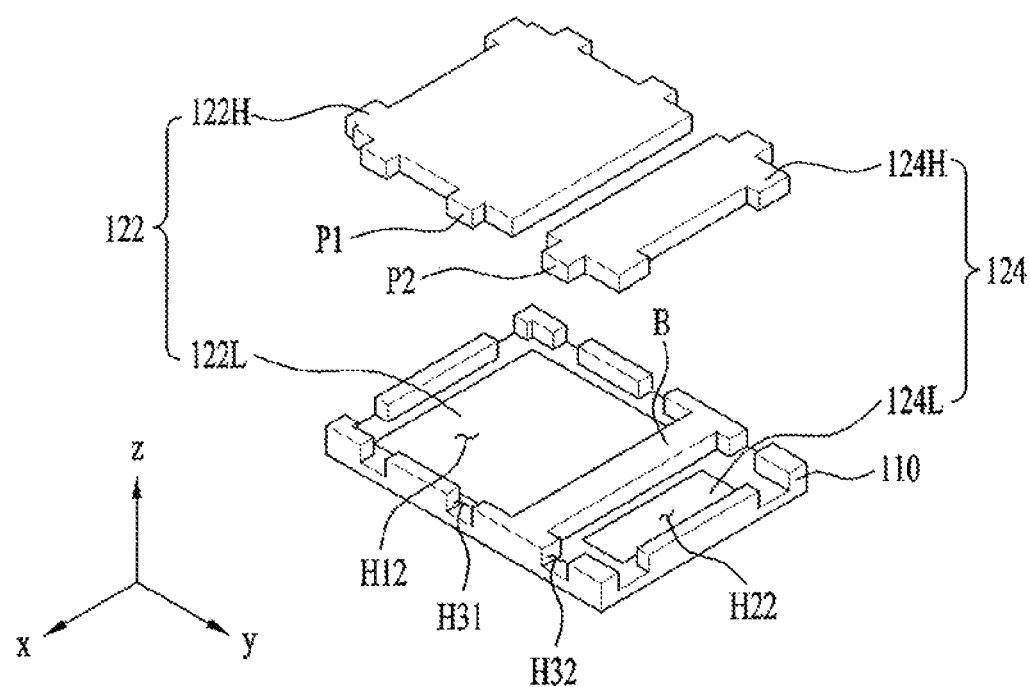

[FIG. 6]
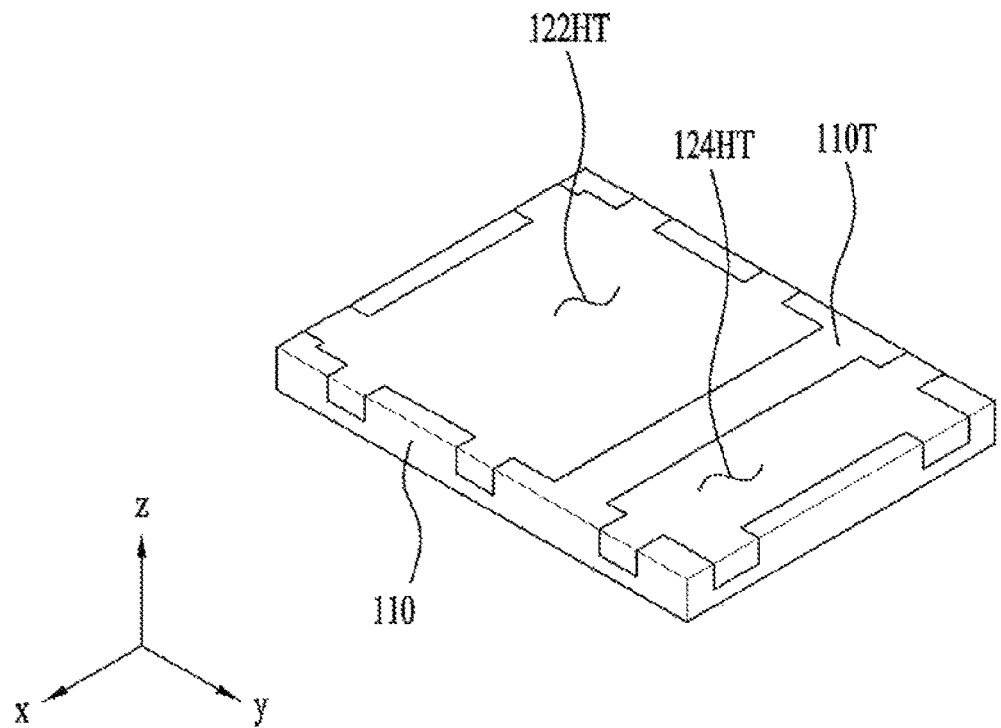
[FIG. 7a]
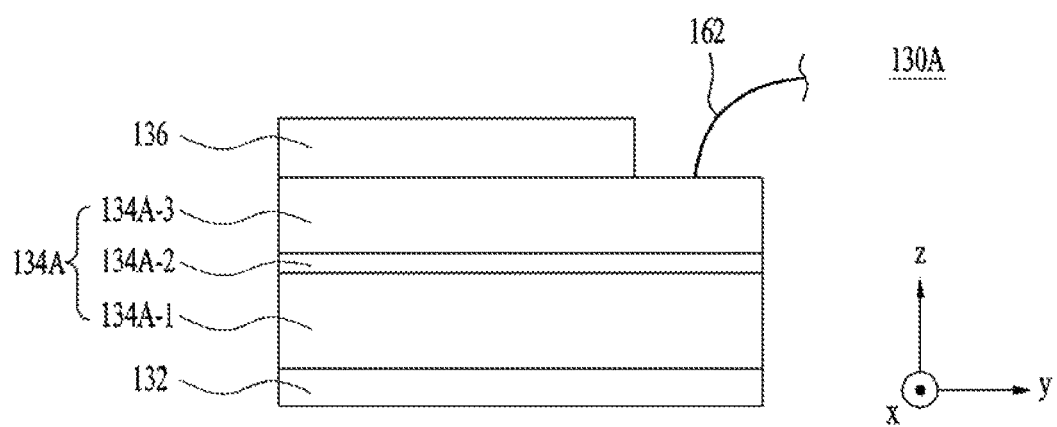

[FIG. 7b]
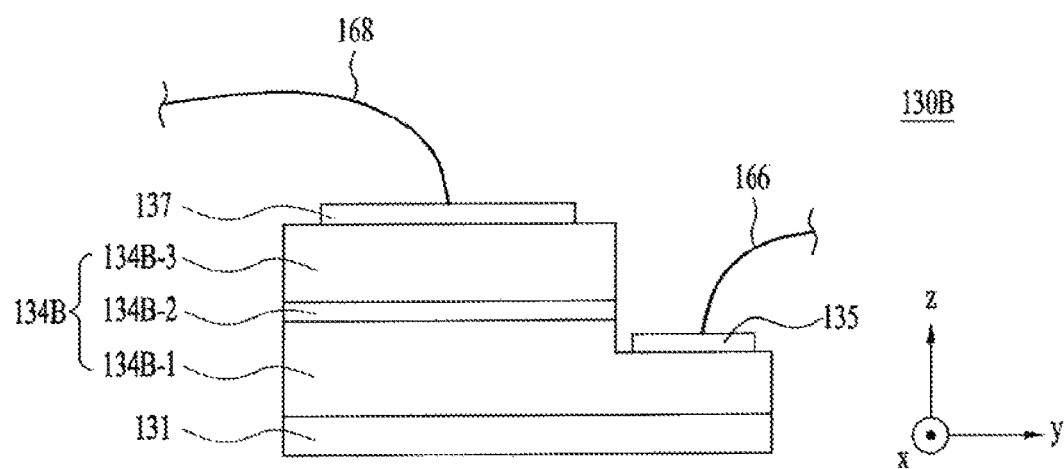
[FIG. 7c]
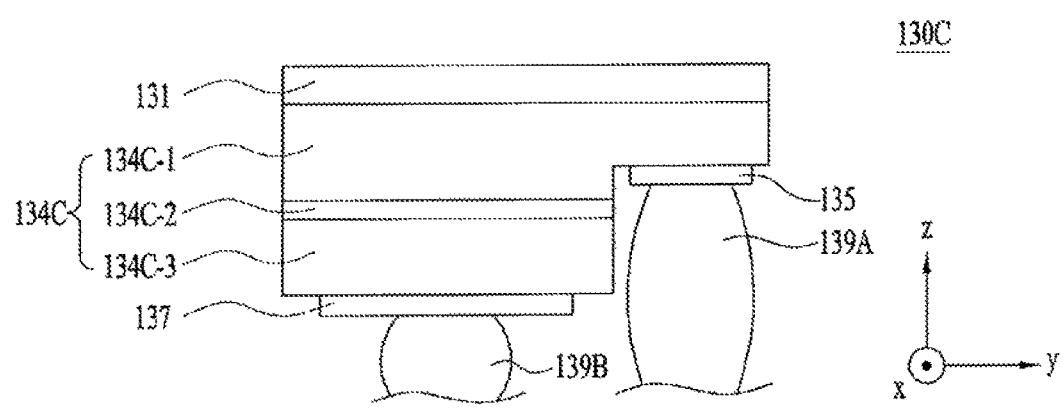

[FIG. 8]
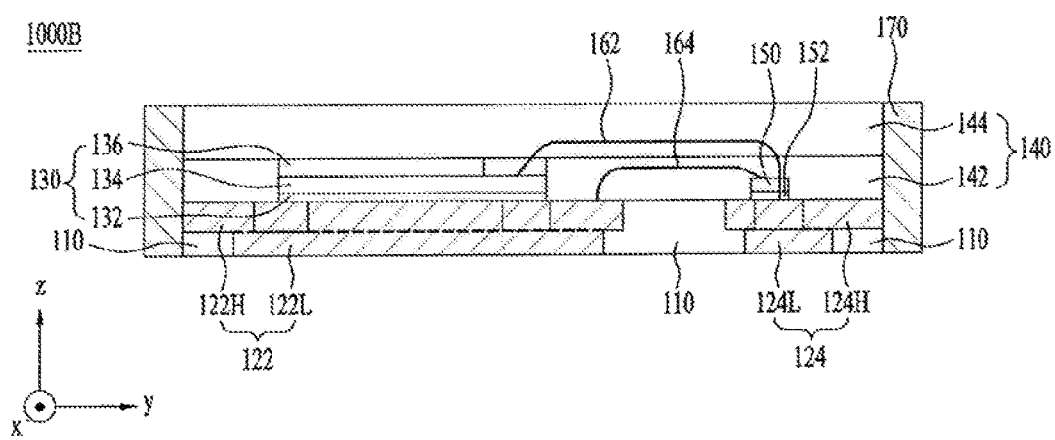
[FIG. 9a]
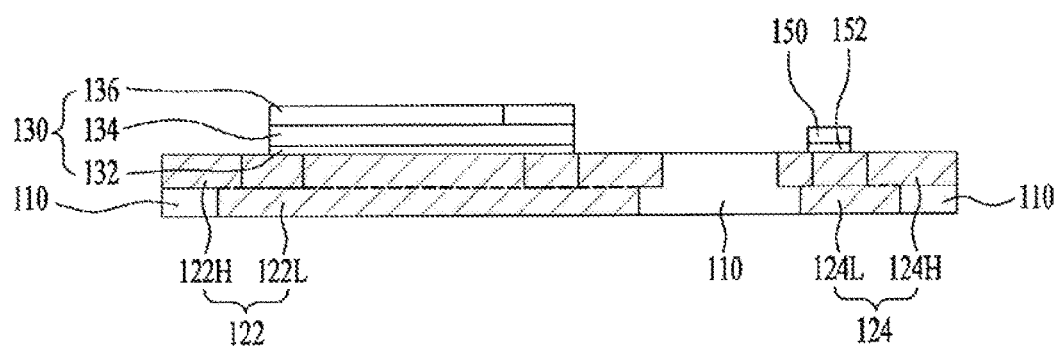

【FIG. 9b】
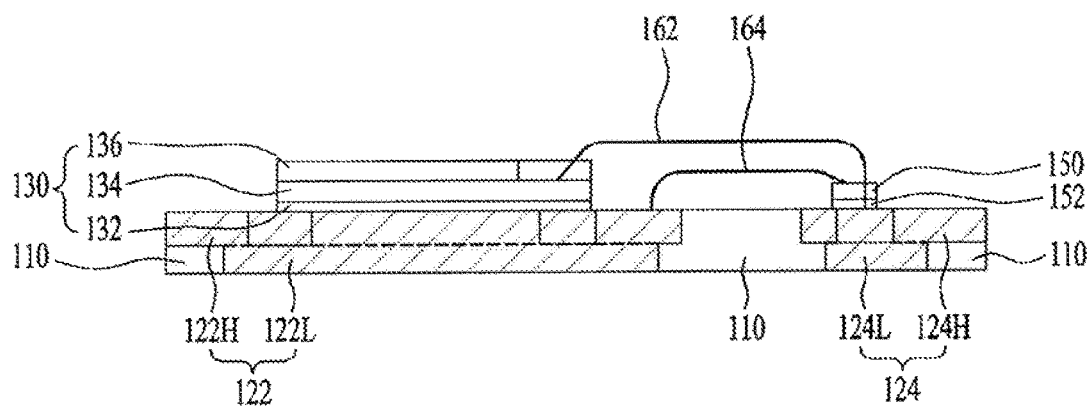
【FIG. 9c】
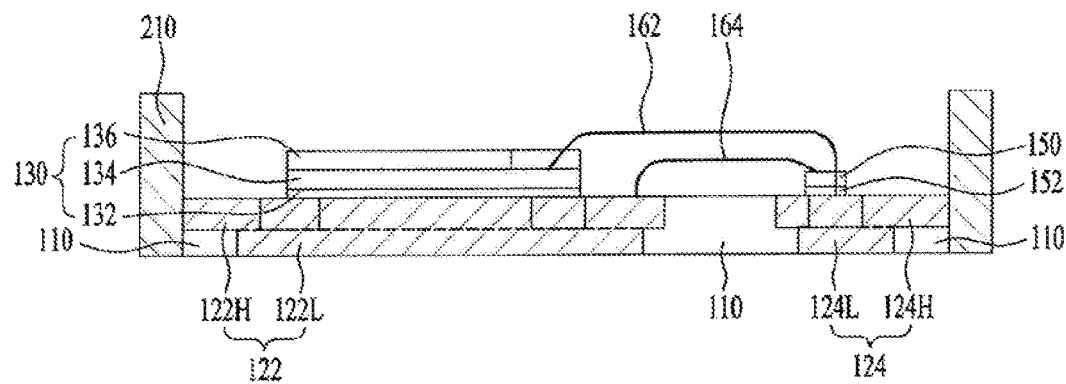

[FIG. 9d]
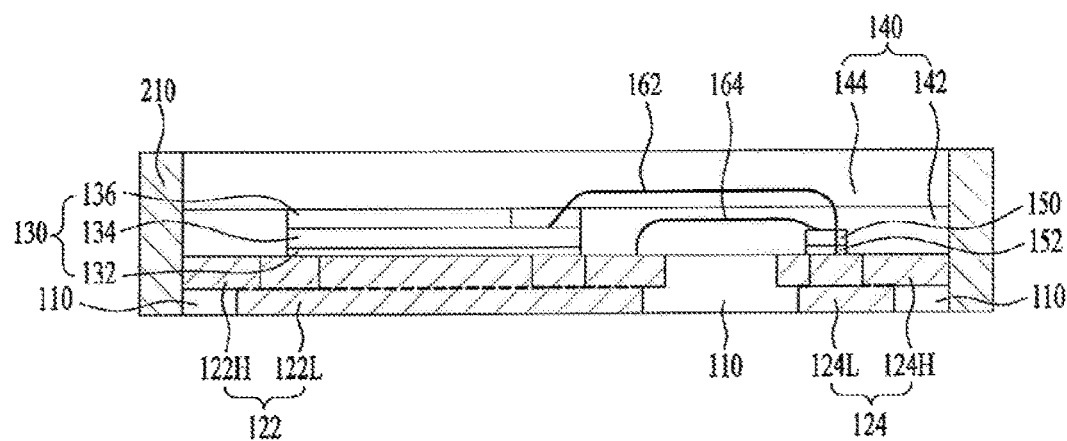

[FIG. 10]
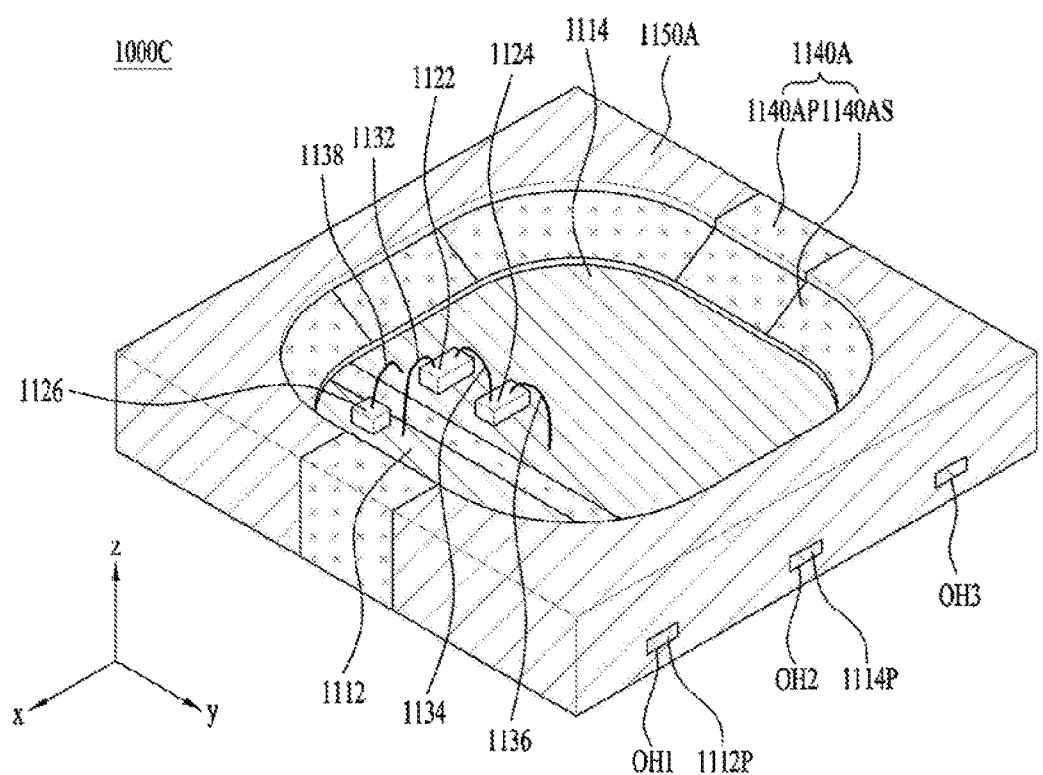

【FIG. 11】
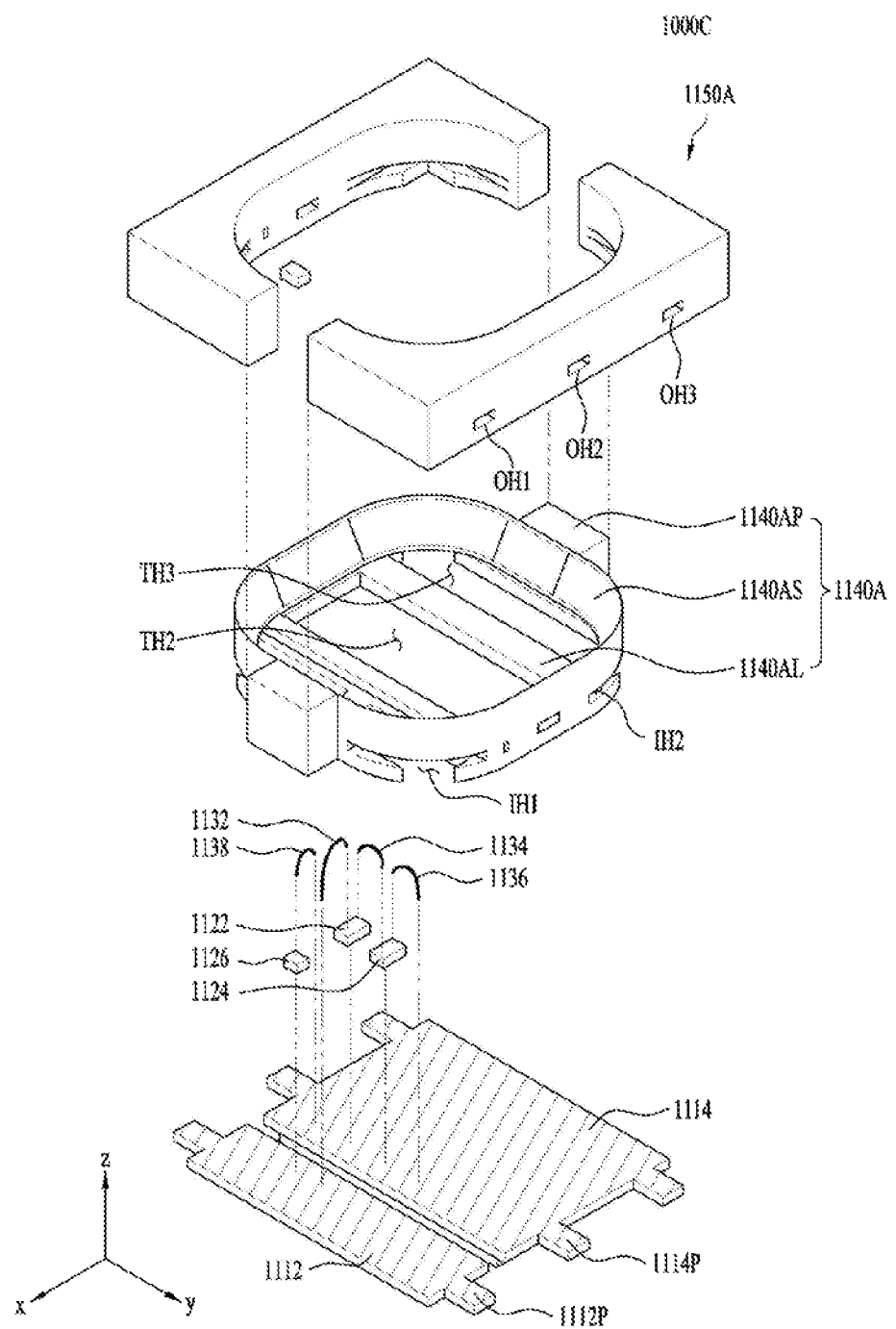

【FIG. 12】
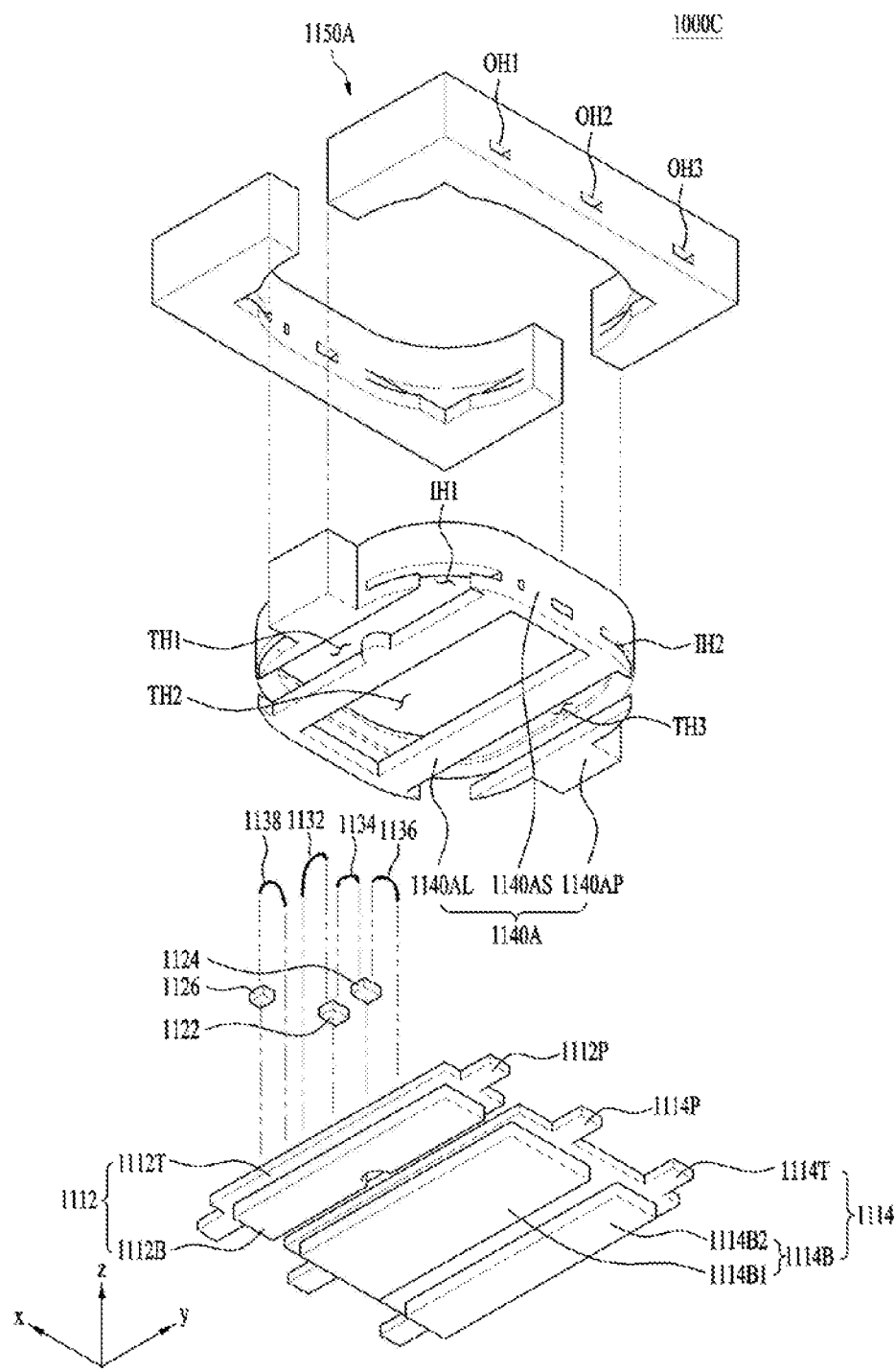

[FIG. 13]
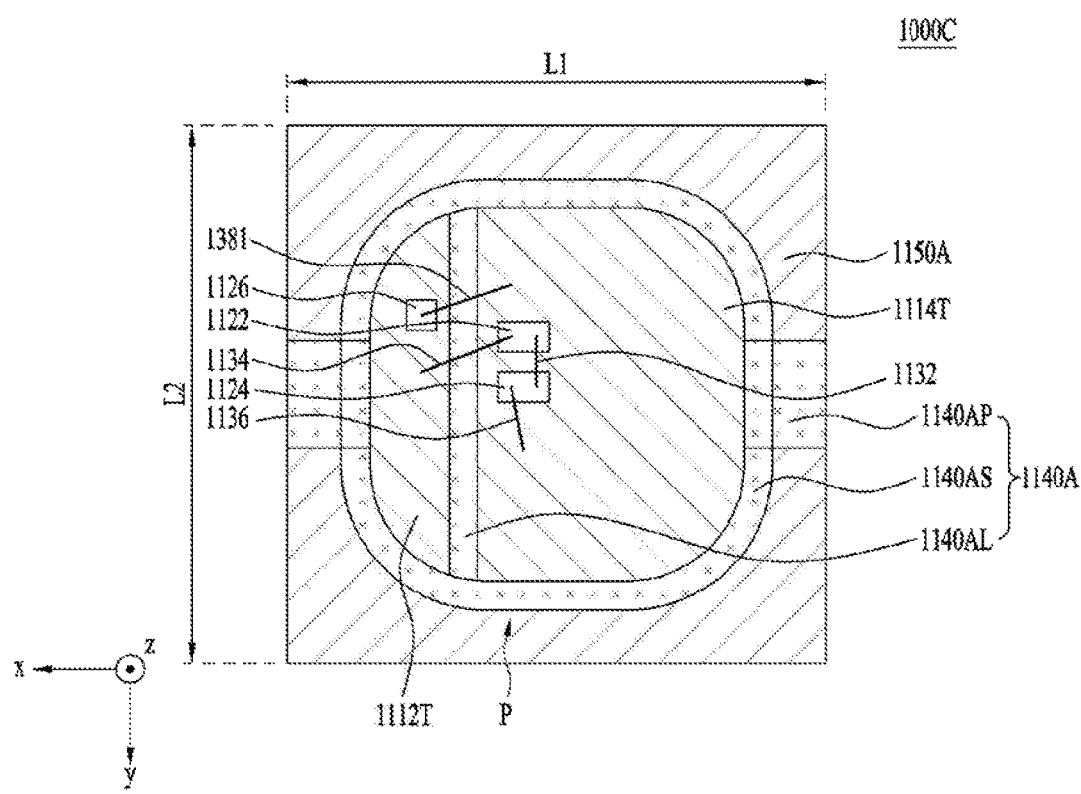

[FIG. 14]
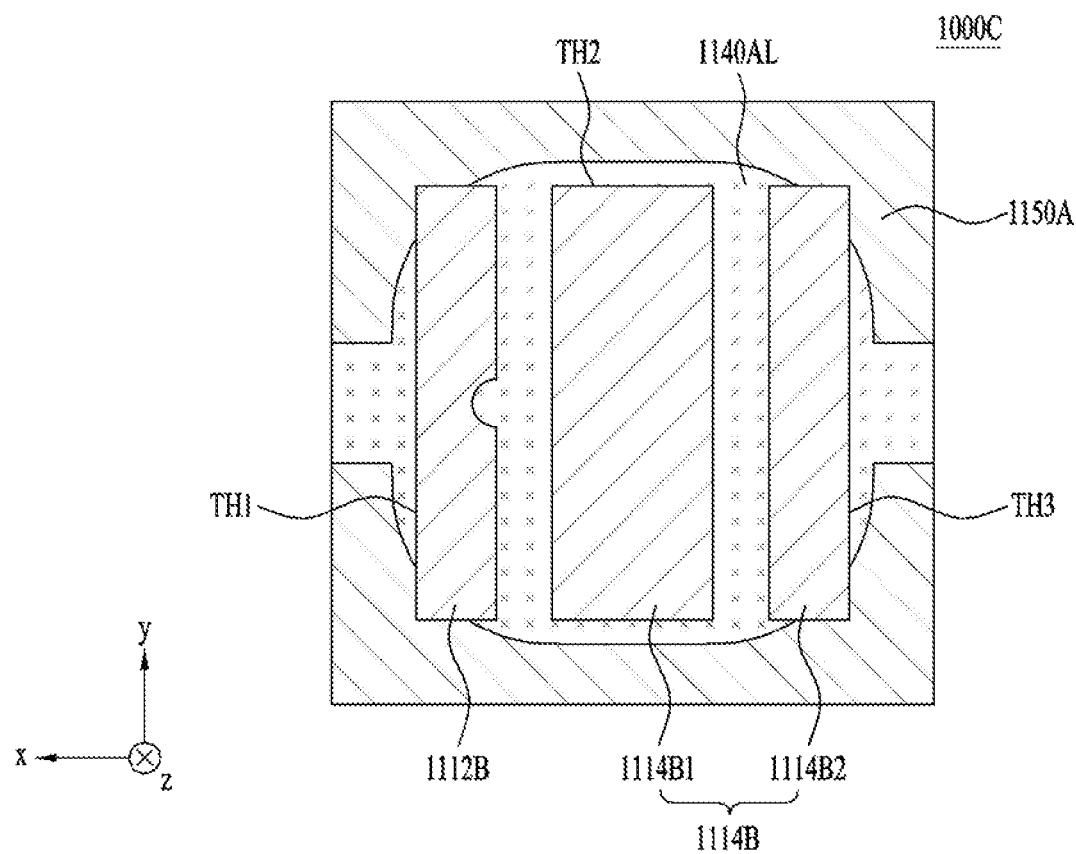

[FIG. 15]
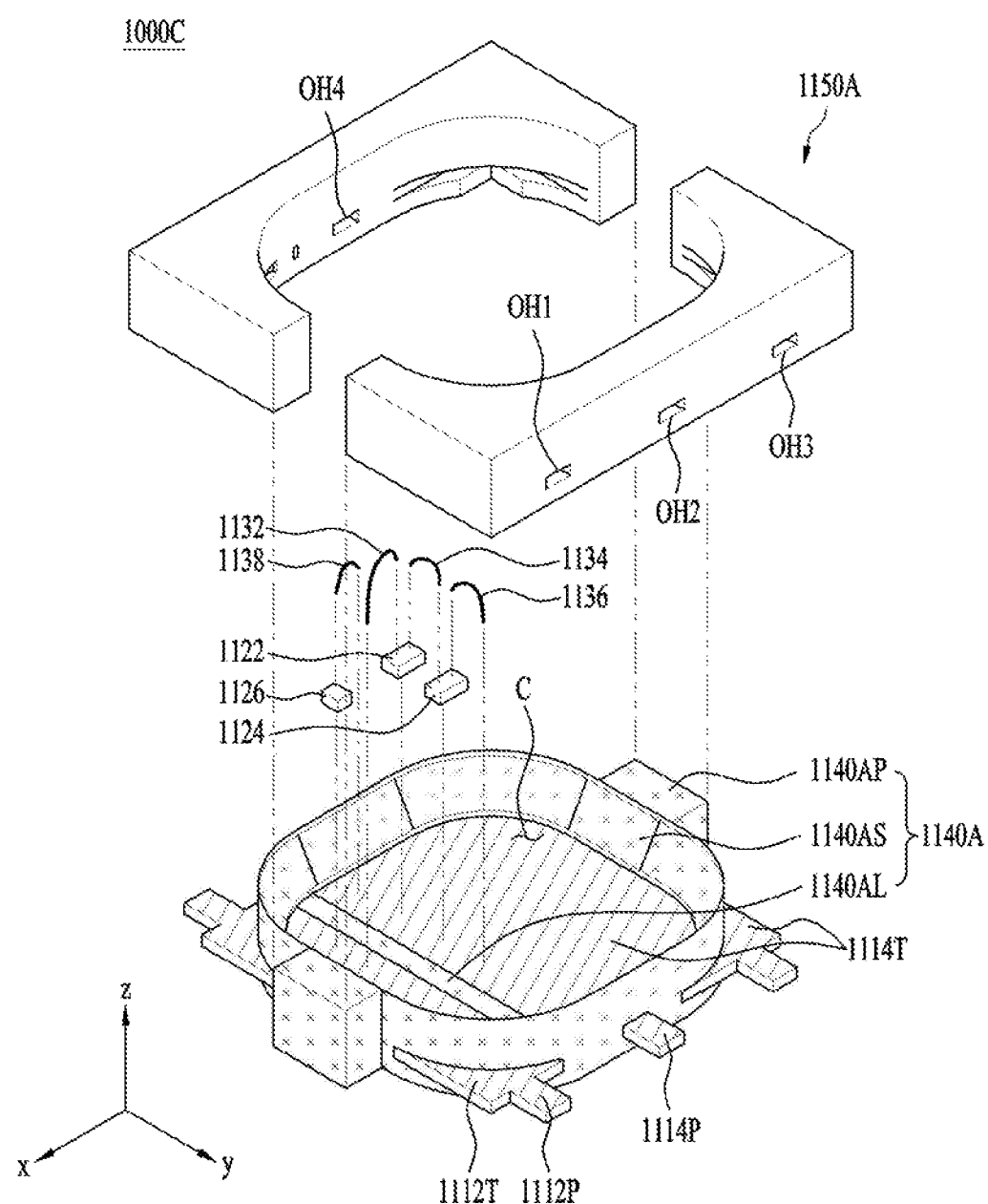

[FIG. 16]
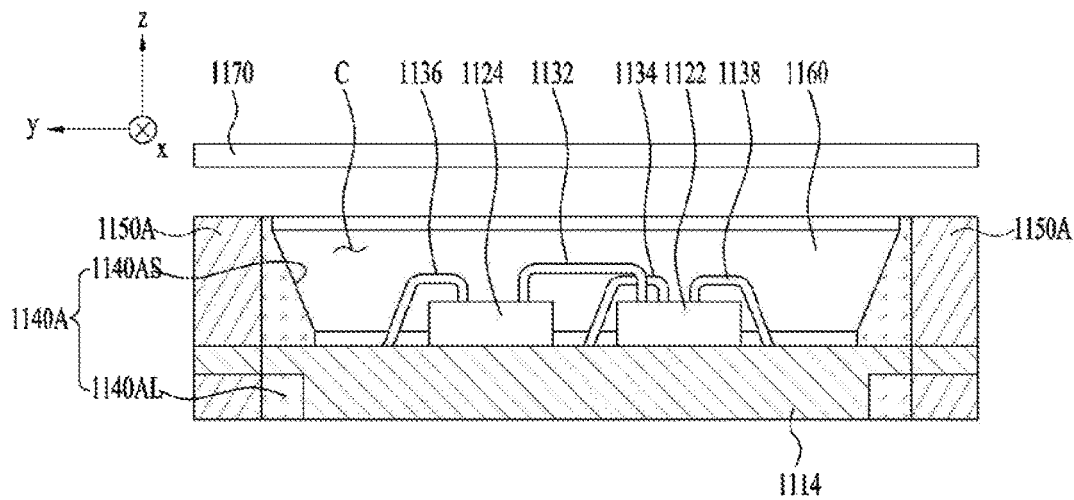
[FIG. 17]
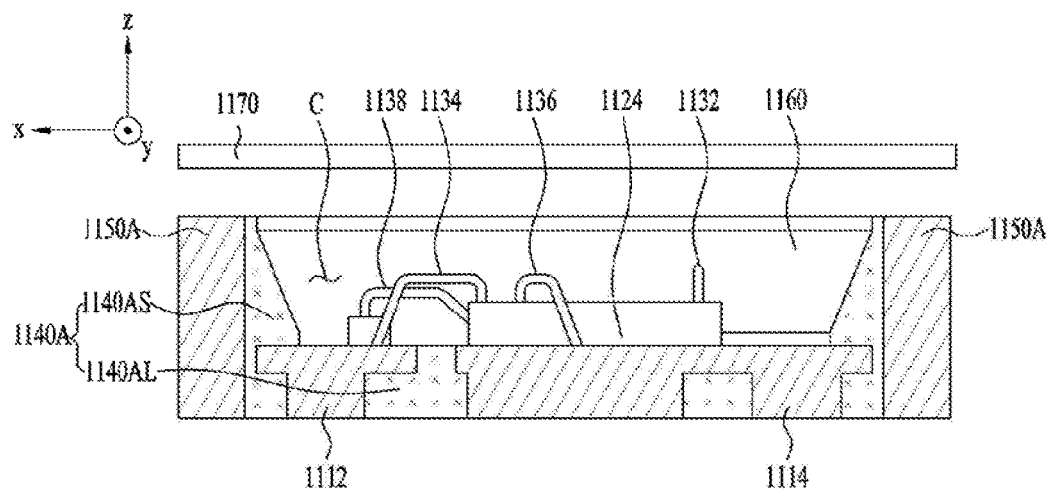

[FIG. 18]
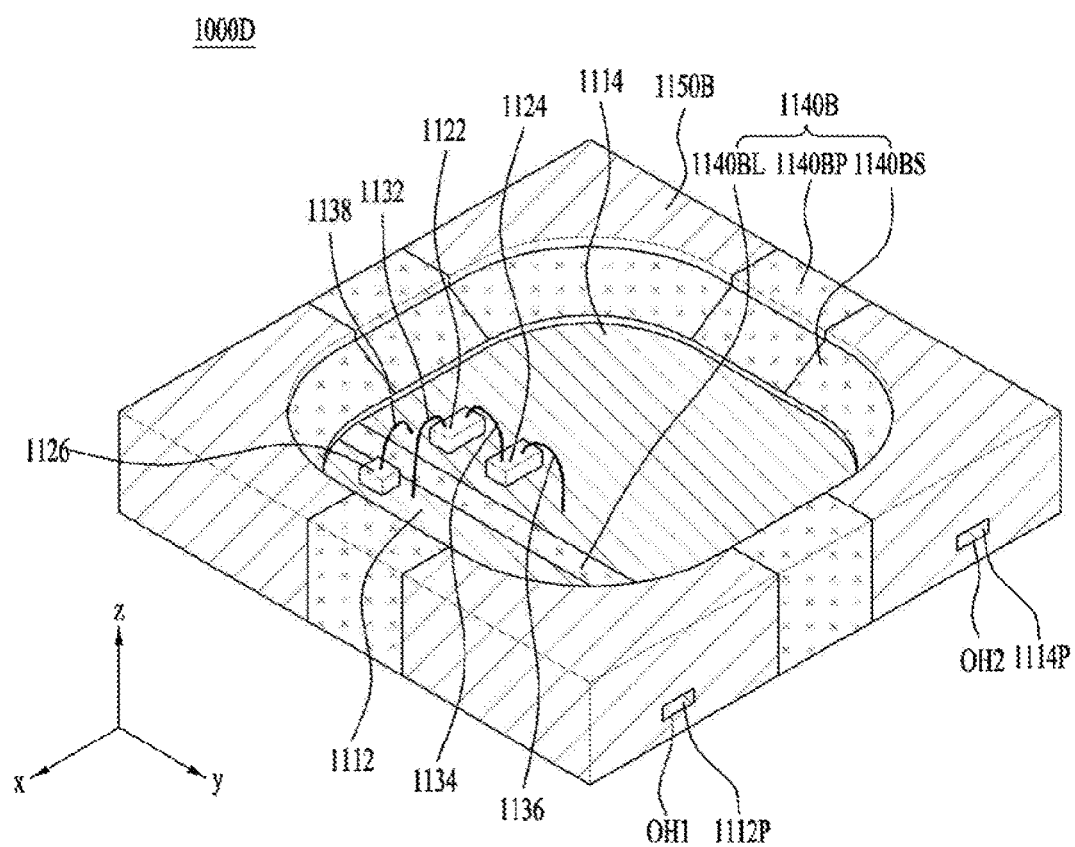

[FIG. 19]
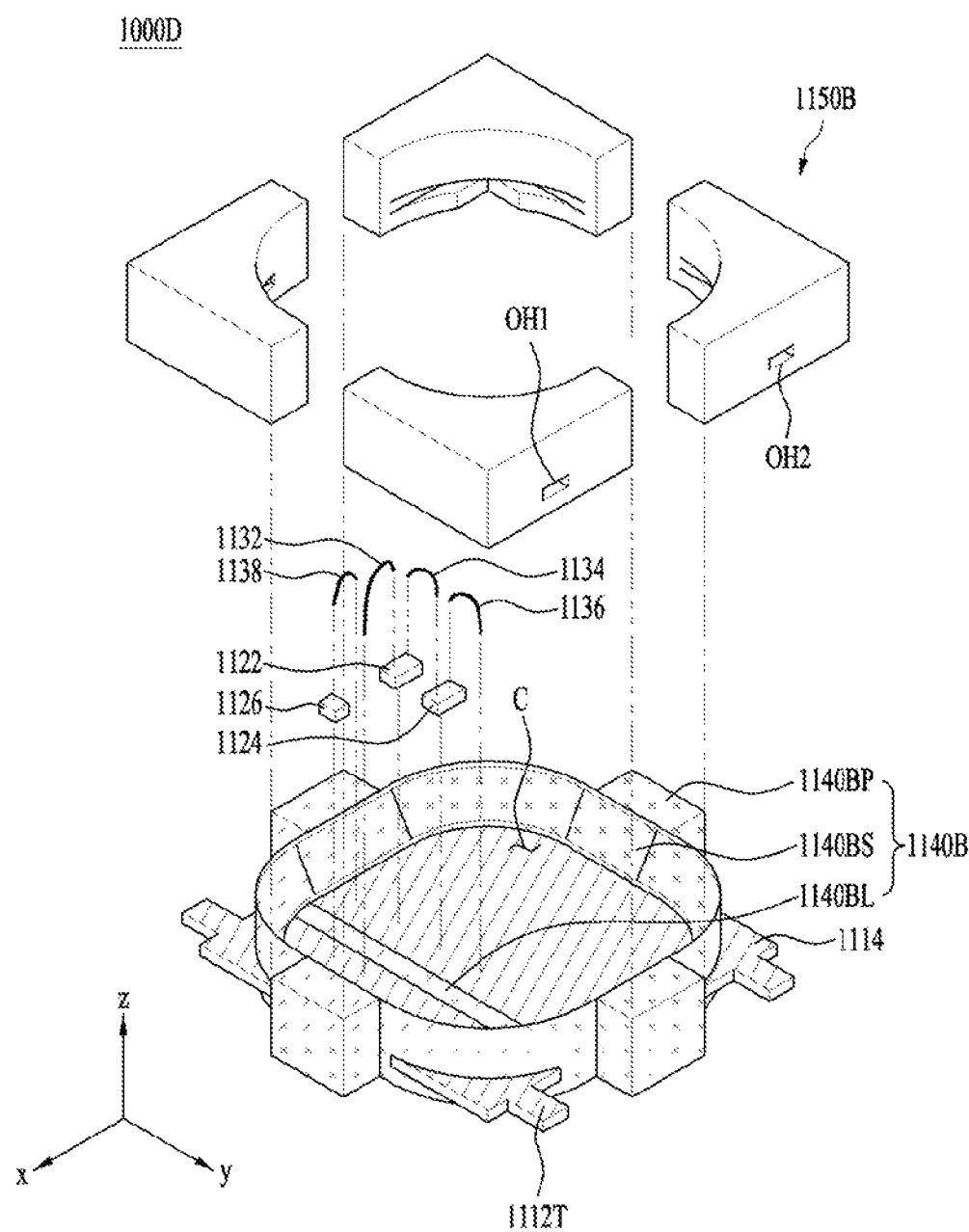

【FIG. 20a】
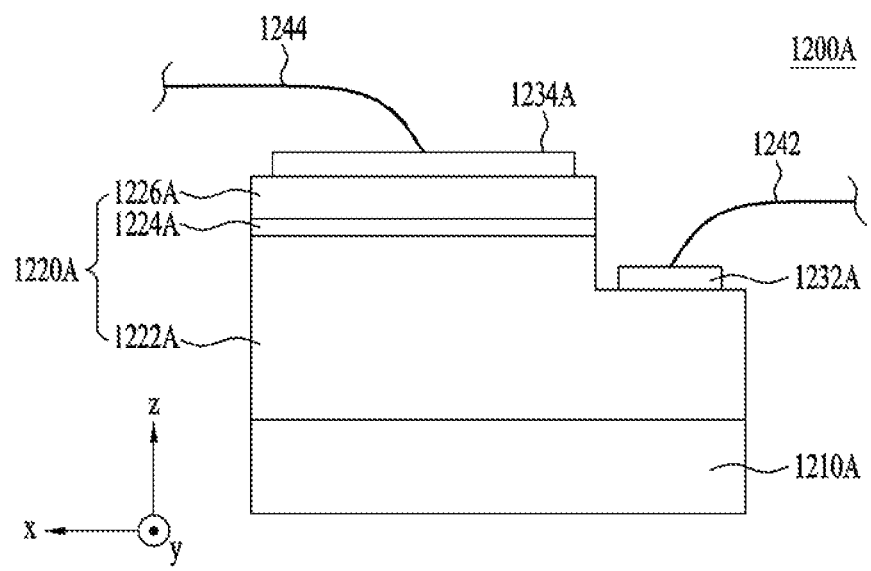
【FIG. 20b】
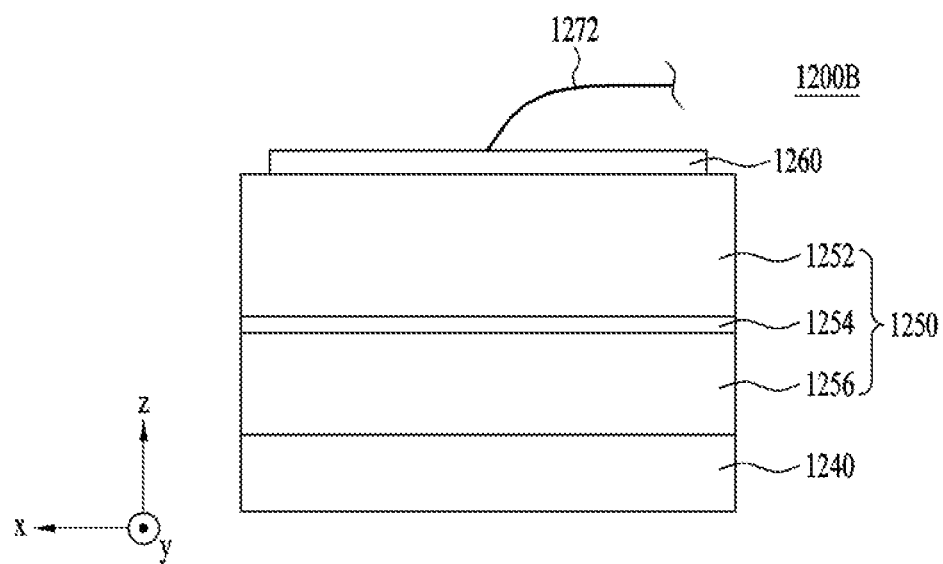

[FIG. 20c]
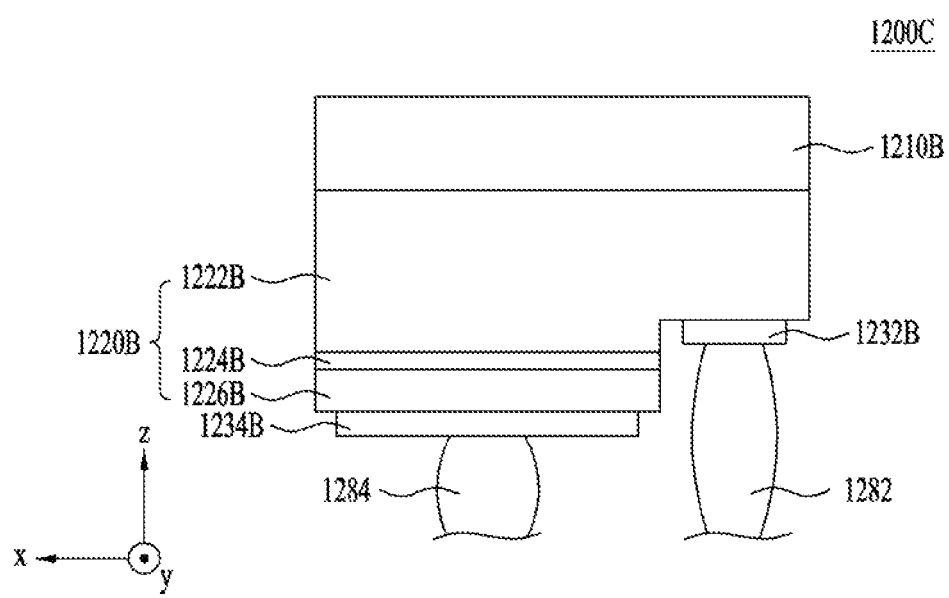

LIGHT EMITTING DEVICE PACKAGE HAVING A BLACK EPOXY MOLDING COMPOUND (EMC) BODY AND LIGHTING APPARATUS INCLUDING THE SAME

CROSS REFERENCE TO RELATED APPLICATIONS

This application is the National Phase of PCT International Application No. PCT/KR2017/001498, filed on Feb. 10, 2017, which claims priority under 35 U.S.C. 119(a) to Patent Application No. 10-2016-0016104, filed in the Republic of Korea, on Feb. 12, 2016, and Patent Application No. 10-2016-0021779, filed in the Republic of Korea, on Feb. 24, 2016, all of which are hereby expressly incorporated by reference into the present application.

TECHNICAL FIELD

Embodiments relate to a light emitting device package and a lighting apparatus including the same.

BACKGROUND ART

Light-emitting diodes (LEDs) are one type of semiconductor element that converts electricity into infrared rays or light using the characteristics of a compound semiconductor, in order to transmit or receive signals or to be used as a light source.

Group III-V nitride semiconductors are in the spotlight as a core material for light emitting devices such as light-emitting diodes (LEDs) or laser diodes (LDs) due to the physical and chemical properties thereof.

Such light-emitting diodes have excellent environmental friendliness because they include no environmentally harmful materials such as mercury (Hg), which has conventionally been used in lighting apparatuses such as incandescent lamps and fluorescent lamps, and also have other advantages, for example, a long lifespan and low power consumption. Therefore, existing light sources are being replaced with light-emitting diodes.

In a conventional light emitting device package including a light-emitting diode, a substrate is formed of a ceramic, for example, and is susceptible to cracking and exhibits high manufacturing costs. In addition, in the conventional light emitting device package including a light-emitting diode, the outer periphery thereof is insufficiently rigid, thereby being susceptible to cracking.

Technical Object

One embodiment provides a light emitting device package having improved characteristics and a lighting apparatus including the same.

Another embodiment provides a light emitting device package which is capable of exhibiting excellent rigidity and maintaining high light extraction efficiency, and a lighting apparatus including the same.

Technical Solution

One embodiment may provide a light emitting device package including a body including a black epoxy molding compound (EMC) containing carbon black, first and second lead frames electrically separated from each other by the body, a light emitting device disposed above at least one of the first lead frame or the second lead frame, and a molding member disposed above the body and the first and second lead frames so as to surround the light emitting device.

For example, a top surface of the body and a top surface of each of the first and second lead frames may be located on a single horizontal plane.

For example, the top surface of the body and the top surface of each of the first and second lead frames may have a flat shape.

For example, thermal resistance from the light emitting device to a lower end of the first and second lead frames may be 5° C./W.

For example, the light emitting device may include a light-emitting structure.

For example, the light-emitting structure may include a first conductivity type semiconductor layer, an active layer disposed above the first conductivity type semiconductor layer, and a second conductivity type semiconductor layer disposed above the active layer. Here, the light emitting device package may further include a first wire configured to electrically connect the second conductivity type semiconductor layer to the second lead frame, and the first conductivity type semiconductor layer may be electrically connected to the first lead frame. Alternatively, the light emitting device package may further include a first wire configured to electrically connect the first conductivity type semiconductor layer to the first lead frame and a second wire configured to electrically connect the second conductivity type semiconductor layer to the second lead frame.

Alternatively, for example, the light emitting device may include a first conductivity type semiconductor layer, an active layer disposed below the first conductivity type semiconductor layer, and a second conductivity type semiconductor layer disposed below the active layer, and the light emitting device may further include a substrate disposed above the light-emitting structure, a first electrode disposed below the first conductivity type semiconductor layer, and a second electrode disposed below the second conductivity type semiconductor layer. In this case, the light emitting device package may further include a first solder part disposed between the first electrode and the first lead frame and a second solder part disposed between the second electrode and the second lead frame.

For example, the molding member may include a first molding member configured to surround a side portion of the light emitting device and disposed above the first and second lead frames and a second molding member configured to surround an upper portion of the light emitting device and disposed above the first molding member.

For example, a thickness of the first molding member may be the same as a thickness of the light emitting device. A thickness of the body may be the same as a thickness of the first and second lead frames.

For example, the first lead frame may include a first-first layer and a first-second layer disposed above the first-first layer, the first-second layer being wider than the first-first layer, and the second lead frame may include a second-first layer and a second-second layer disposed above the second-first layer, the second-second layer being wider than the second-first layer. The body may include a first-first accommodation space in which the first-first layer is accommodated, a second-first accommodation space in which the second-first layer is accommodated, a partition disposed so as to separate the first-first accommodation space and the second-first accommodation space from each other, a first-second accommodation space, in which the first-second layer is accommodated, and which is located above the first-first accommodation space, and a second-second accommodation space, in which the second-second layer is accommodated, and which is located above the second-first accommodation space.

For example, the first-second layer may include at least one first protrusion configured to protrude outwards from the first-second accommodation space, the second-second layer may include at least one second protrusion configured to protrude outwards from the second-second accommodation space, and the body may include a plurality of blind holes configured to accommodate therein the first and second protrusions.

For example, the first-first layer and the first-second layer may be integrated, and the second-first layer and the second-second layer may be integrated.

For example, the light emitting device package may further include a dam configured to confine the molding member together with the first and second lead frames.

For example, the light emitting device package may further include a Zener diode disposed above the first lead frame or the second lead frame and a third wire configured to electrically connect the Zener diode to the second lead frame.

For example, the first and second lead frames may be coupled to the body by injection molding.

Another embodiment may provide a light emitting device package including first and second lead frames, an inner body configured to electrically separate the first and second lead frames from each other and defining a cavity together with the first and second lead frames, a light source disposed inside the cavity in at least one of the first lead frame or the second lead frame, and an outer body configured to surround an outer side surface of the inner body and formed of a material different from that of the inner body.

For example, each of the inner body and the outer body may include an EMC.

For example, the inner body may include a white EMC, and the outer body may include a black EMC.

For example, the inner body may include a lower portion configured to electrically separate the first and second lead frames from each other, and a side portion configured to extend from the lower portion so as to form a side surface of the cavity.

For example, the inner body may further include a reflective protrusion configured to penetrate an upper surface of the outer body. The reflective protrusion may divide the upper surface of the outer body into two or four.

For example, the reflective protrusion may have a symmetrical planar shape.

For example, the lower portion of the inner body may include a plurality of through-holes, the first lead frame may include a first lower lead frame inserted into and disposed in some of the through-holes and a first upper lead frame disposed above the first lower lead frame and defining a portion of a bottom surface of the cavity, and the second lead frame may include a second lower lead frame inserted into and disposed in the remaining through-holes and a second upper lead frame disposed above the second lower lead frame and defining a remaining portion of the bottom surface of the cavity.

For example, the first lower lead frame and the first upper lead frame may be integrated, and the second lower lead frame and the second upper lead frame may be integrated.

For example, the first upper lead frame, the second upper lead frame, and the lower portion of the inner body may form a single horizontal plane corresponding to the bottom surface of the cavity.

For example, the side portion of the inner body may include at least one inner fastening hole, the outer body may include at least one outer fastening hole, which communicates with the inner fastening hole, and each of the first and second lead frames may include a fastening protrusion configured to be buried in the inner fastening hole and the outer fastening hole so as to fasten the inner body and the outer body to each other.

For example, the at least one inner fastening hole may include a plurality of inner fastening holes spaced apart from each other by a constant distance, and the at least one outer fastening hole may include a plurality of outer fastening holes spaced apart from each other by a constant distance.

For example, the light emitting device package may further include a molding member configured to be buried in the cavity so as to surround the light source.

For example, the light emitting device package may further include an upper structure disposed so as to cover the cavity.

For example, the inner body and the outer body may have a symmetrical planar shape. A further embodiment may provide a lighting apparatus including the light emitting device package.

Advantageous Effects

In one embodiment, unlike a conventional light emitting device package having a ceramic or AlN substrate, a light emitting device package and a lighting apparatus including the same may be manufactured at lower cost, may exhibit better rigidity, injection moldability, and processability, may be manufactured in a greater number per unit time, may exhibit a higher degree of freedom in design and better heat dissipation, and may prevent the generation of cracks and dust. In another embodiment, an inner body is formed of a white EMC having reflectivity higher than that of a black EMC and an outer body is formed of a black EMC having rigidity higher than that of a white EMC, whereby the light emitting device package and the lighting apparatus including the same may exhibit excellent light extraction efficiency and strong rigidity.

DESCRIPTION OF DRAWINGS

FIG. 1 illustrates an exploded perspective view of the entirety of a light emitting device package according to an embodiment.

FIG. 2 illustrates a partially assembled perspective view of the light emitting device package illustrated in FIG. 1.

FIG. 3 illustrates a cross-sectional view taken along the middle of the light emitting device package illustrated in FIGS. 1 and 2.

FIG. 4 illustrates an exploded perspective view of first and second lead frames and a body illustrated in FIGS. 1 to 3.

FIG. 5 illustrates a partially assembled perspective view of the first and second lead frames and the body.

FIG. 6 illustrates a fully assembled perspective view of the first and second lead frames and the body.

FIGS. 7a to 7c illustrate cross-sectional views of various embodiments of a light emitting device included in the light emitting device package according to the embodiment.

FIG. 8 illustrates a cross-sectional view of a light emitting device package according to another embodiment.

FIGS. 9a to 9d illustrate process cross-sectional views for explaining a method of manufacturing the light emitting device package according to the embodiment.

FIG. 10 illustrates a top assembled perspective view of a light emitting device package according to still another embodiment.

FIG. 11 illustrates a top exploded perspective view of the light emitting device package illustrated in FIG. 10.

FIG. 12 illustrates a bottom exploded perspective view of the light emitting device package illustrated in FIG. 10.

FIG. 13 illustrates a plan view of the light emitting device package illustrated in FIG. 10.

FIG. 14 illustrates a bottom view of the light emitting device package illustrated in FIG. 10.

FIG. 15 illustrates a top partially assembled perspective view of the light emitting device package illustrated in FIG. 10.

FIGS. 16 and 17 illustrate cross-sectional views of the light emitting device package illustrated in FIG. 10.

FIG. 18 illustrates a top assembled perspective view of a light emitting device package according to a further embodiment.

FIG. 19 illustrates a top partially assembled perspective view of the light emitting device package illustrated in FIG. 18.

FIGS. 20a to 20c illustrate cross-sectional views of various embodiments of each light source included in the light emitting device package according to the embodiment.

BEST MODE

Hereinafter, embodiments will be described in detail with reference to the accompanying drawings, in order to concretely describe the disclosure and to assist in understanding of the disclosure. However, the embodiments disclosed here may be altered into various other forms, and the scope of the disclosure should not be construed as being limited to the embodiments. The embodiments disclosed here are provided in order to more completely describe the disclosure to those of ordinary skill in the art.

In the description of the embodiments, when an element is referred to as being formed "on" or "under" another element, it can be directly "on" or "under" the other element or be indirectly formed with intervening elements therebetween. It will also be understood that "on" or "under" the element may be described relative to the drawings.

In addition, relative terms such as, for example, "first", "second", "on/upper/above" and "beneath/lower/below", used in the following description may be used to distinguish any one substance or element with another substance or element without requiring or containing any physical or logical relationship or sequence between these substances or elements.

Although light emitting device packages 1000A, 1000B, 1000C and 1000D according to embodiments will be described using the Cartesian coordinate system, the embodiments are not limited thereto. That is, with the Cartesian coordinate system, the x-axis, the y-axis and the z-axis may be orthogonal to one another, but the embodiments are not limited thereto. That is, the x-axis, the y-axis and the z-axis may not be orthogonal to one another, but may cross one another.

Hereinafter, light emitting device packages 1000A and 1000B according to one embodiment and another embodiment will be described with reference to the accompanying drawings.

FIG. 1 illustrates an exploded perspective view of the entirety of the light emitting device package 1000A according to one embodiment, FIG. 2 illustrates a partially assembled perspective view of the light emitting device package 1000A illustrated in FIG. 1, and FIG. 3 illustrates a cross-sectional view taken along the middle of the light emitting device package 1000A illustrated in FIGS. 1 and 2.

Referring to FIGS. 1 to 3, the light emitting device package 1000A according to one embodiment includes a body 110, first and second lead frames 122 and 124, a light emitting device 130, a molding member 140, a Zener diode 150, an adhesive layer 152, and first and third wires 162 and 164.

The body 110 may include a black epoxy molding compound (EMC) containing carbon black. The body 110 is a part that corresponds to a base of the light emitting device package 1000A.

The first lead frame 122 and the second lead frame 124 may be electrically separated from each other by the body 110. The first and second lead frames 122 and 124 serve to supply a voltage to the light emitting device 130. In addition, the first and second lead frames 122 and 124 may serve to reflect light generated in the light emitting device 130 so as to increase luminous efficacy, and may also serve to outwardly dissipate heat generated in the light emitting device 130. Each of the first and second lead frames 122 and 124 may be formed of an electrically conductive material such as copper (Cu), but the embodiment is not limited to any specific material of the first and second lead frames 122 and 124.

The first lead frame 122 may include a first-first layer 122L and a first-second layer 122H. The first-first layer 122L corresponds to a lower layer of the first lead frame 122, and the first-second layer 122H corresponds to an upper layer of the first lead frame 122. The first-second layer 122H may be disposed above the first-first layer 122L, and may have an area wider than that of the first-first layer 122L. Referring to FIGS. 1 and 2, the first-first layer 122L and the first-second layer 122H are illustrated as being separate layers, but the embodiment is not limited thereto. According to another embodiment, as illustrated in FIG. 3, the first-first layer 122L and the first-second layer 122H may be integrated.

The second lead frame 124 may include a second-first layer 124L and a second-second layer 124H. The second-first layer 124L corresponds to a lower layer of the second lead frame 124, and the second-second layer 124H corresponds to an upper layer of the second lead frame 124. The second-second layer 124H may be disposed above the second-first layer 124L, and may have an area wider than that of the second-first layer 124L. Referring to FIGS. 1 and 2, the second-first layer 124L and the second-second layer 124H are illustrated as being separate layers, but the embodiment is not limited thereto. According to another embodiment, as illustrated in FIG. 3, the second-first layer 124L and the second-second layer 124H may be integrated.

In the case in which the first lead frame 122, which is divided into the first-first and first-second layers 122L and 122H having different areas, and the second lead frame 124, which is divided into the second-first and second-second layers 124L and 124H having different areas, are disposed on the body 110, the first and second lead frames 122 and 124 may be stably supported on and fixed to the body 110 and the contact area between the first and second lead frames 122 and 124 and the body 110 may be increased, which may further improve heat dissipation.

FIG. 4 illustrates an exploded perspective view of the first and second lead frames 122 and 124 and the body 110 illustrated in FIGS. 1 to 3, FIG. 5 illustrates a partially assembled perspective view of the first and second lead frames 122 and 124 and the body 110, and FIG. 6 illustrates a fully assembled perspective view of the first and second lead frames 122 and 124 and the body 110.

Referring to FIGS. 4 to 6, the body 110 may include first-first and second-first accommodation spaces H11 and H21, first-second and second-second accommodation spaces H12 and H22, and a partition B.

Referring to FIG. 4, the first-first accommodation space H11 is a space in which the first-first layer 122L of the first lead frame 122 is accommodated, and the second-first accommodation space H21 is a space in which the second-first layer 124L of the second lead frame 124 is accommodated. Here, the first-first accommodation space H11 and the second-first accommodation space H21 may be spaced apart from each other by the partition B of the body 110. Thus, as illustrated in FIG. 5, the first-first layer 122L of the first lead frame 122 accommodated in the first-first accommodation space H11 and the second-first layer 124L of the second lead frame 124 accommodated in the second-first accommodation space H21 may be electrically separated from each other by the partition B of the body 110.

Referring to FIG. 5, the first-second accommodation space H12 is a space in which the first-second layer 122H of the first lead frame 122 is accommodated, and is located above the first-first accommodating space H11. The second-second accommodation space H22 is a space in which the second-second layer 124H of the second lead frame 124 is accommodated, and is located above the second-first accommodation space H21. Here, the first-second accommodation space H12 and the second-second accommodation space H22 may be spaced apart from each other by the partition B of the body 110. Thus, as illustrated in FIG. 6, the first-second layer 122H of the first lead frame 122 accommodated in the first-second accommodation space H12 and the second-second layer 124H of the second lead frame 124 accommodated in the second-second accommodation space H22 may be electrically separated from each other by the partition B.

In addition, the first-second layer 122H of the first lead frame 122 includes at least one first protrusion P1, which protrudes outwards from the first-second accommodation space H12. The second-second layer 124H of the second lead frame 124 may include at least one second protrusion P2, which protrudes outwards from the second-second accommodation space H22.

The body 110 may further include a plurality of blind holes H31 and H32. The first blind hole H31 may be shaped so as to accommodate the first protrusion P1, and the second blind hole H32 may be shaped so as to accommodate the second protrusion P2.

By the coupling of the first blind hole H31 and the first protrusion P1 and the coupling of the second blind hole H32 and the second protrusion P2, the first and second lead frames 122 and 124 may be stably supported on and fixed to the body 110, and the contact area between the first and second lead frames 122 and 124 and the body 110 may be increased, which may further improve heat dissipation.

According to the embodiment, the body 110 is formed of a black EMC, so that a top surface 110T of the body 110 may have a flat shape, as illustrated in FIG. 6.

Moreover, a top surface 122HT of the first lead frame 122 and a top surface 124HT of the second lead frame 124 may have a flat shape. In this case, the top surface 110T of the body 110 and the top surfaces 122HT and 124HT of the first and second lead frames 122 and 124 may be located on the same horizontal plane.

In addition, referring to FIG. 2, the body 110 may have a first thickness T1, and each of the first frame 122 and the second frame 124 may have a second thickness T2. As illustrated, the second thickness T2 of the first lead frame 122 corresponds to the sum of the respective thicknesses of the first-first layer 122L and the first-second layer 122H, and the second thickness T2 of the second lead frame 124 corresponds to the sum of the respective thicknesses of the second-first layer 124L and the second-second layer 124H.

In addition, as illustrated, the second thickness T2 of the first lead frame 122 and the second thickness T2 of the second lead frame 124 may be the same. However, according to another embodiment, the second thickness T2 of the first lead frame 122 and the second thickness T2 of the second lead frame 124 may be different.

In addition, the first thickness T1 of the body 110 and the second thickness T2 of each of the first and second lead frames 122 and 124 may be the same as or different from each other.

In addition, as will be described later with regard to a manufacturing process, the first and second lead frames 122 and 124 may be coupled to the body 110 by injection molding.

In addition, although not illustrated, opposite side surfaces of the first and second lead frames 122 and 124 may be plated. That is, each of the lower surface of the first-first layer 122L and the top surface 122HT of the first-second layer 122H of the first lead frame 122 and the lower surface of the second-first layer 124L and the top surface 124HT of the second-second layer 124H of the second lead frame 124 may be plated using silver (Ag) or gold (Au).

Referring again to FIGS. 1 to 3, the light emitting device 130 may be disposed on at least one of the first lead frame 122 or the second lead frame 124.

In addition, as illustrated in FIGS. 1 to 3, the light emitting device 130 may have a vertical bonding structure, but the embodiment is not limited thereto. That is, according to another embodiment, the light emitting device 130 may have a horizontal bonding structure or a flip-chip bonding structure.

FIGS. 7a to 7c illustrate cross-sectional views of various embodiments 130A, 130B and 130C of the light emitting device 130 included in the light emitting device package 1000A according to the embodiment.

The light emitting device 130 illustrated in FIGS. 1 to 3 may have a vertical bonding structure, as illustrated in FIG. 7a. However, according to another embodiment, the light emitting device 130 may have a horizontal bonding structure, as illustrated in FIG. 7b, or may have a flip-chip bonding structure, as illustrated in FIG. 7c.

The light emitting device 130 (130A to 130C) illustrated in FIGS. 7a to 7c may include a light-emitting structure 134A, 134B or 134C.

Regardless of the difference in bonding structure, the light-emitting structure 134A, 134B or 134C may include a first conductivity type semiconductor layer 134A-1, 134B-1 or 1340-1, an active layer 134A-2, 134B-2 or 134C-2, and a second conductivity type semiconductor layer 134A-3, 134B-3 or 134C-3. The light-emitting structures 134A, 134B and 134C may include different constituent materials. A description thereof will be made below.

First, the light emitting device 130A, which has a vertical bonding structure illustrated in FIG. 7a, may include a support substrate 132, the light-emitting structure 134A, and an ohmic-contact layer 136.

The support substrate 132 may serve to support the light-emitting structure 134A, and may include a conductive material. This serves to allow the first conductivity type semiconductor layer 134A-1, disposed on the support substrate 132, to be electrically connected to the first lead frame 122 via the support substrate 132.

For example, the support substrate 132 may include at least one of sapphire ($Al_2O_3$), GaN, SiC, ZnO, GaP, InP, $Ga_2O_3$, GaAs, or Si, but the embodiment is not limited thereto. When the support substrate 132 is a conductive type, the entire support substrate 132 may be formed of a metal having high electrical conductivity because it may serve as a first electrode, and may be formed of a metal having high thermal conductivity because it needs to sufficiently dissipate heat generated during the operation of the light emitting device 130A. To this end, the support substrate 132 may be formed of a material selected from the group consisting of molybdenum (Mo), silicon (Si), tungsten (W), copper (Cu), and aluminum (Al), or an alloy thereof, and may selectively include gold (Au), a copper (Cu) alloy, nickel (Ni), copper-tungsten (Cu—W), a carrier wafer (e.g., GaN, Si, Ge, GaAs, ZnO, SiGe, SiC, $Ga_2O_3$ or the like), for example.

In addition, when the support substrate 132 is formed of a reflective material, the support substrate 132 may reflect the light that is discharged from the light-emitting structure 134A and directed to the support substrate 132, rather than being directed to the upper side or the lateral side, thereby increasing light extraction efficiency.

Alternatively, a reflective layer (not illustrated) may be further disposed between the support substrate 132 and the light-emitting structure 134A.

The reflective layer may serve to upwardly reflect the light discharged from the active layer 134A-2, may be disposed on the support substrate 132, and may have a thickness of about 2500 Å. For example, the reflective layer may be formed of a metal layer including aluminum (Al), silver (Ag), nickel (Ni), platinum (Pt), rhodium (Rh), or an alloy containing Al, Ag, Pt, or Rh. For example, aluminum or silver may effectively reflect the light generated from the active layer 134A-2 so as to greatly increase light extraction efficiency of the light emitting device 130A. In addition, such a reflective layer may have any of various light reflection patterns. The light reflection pattern may have a hemi-spherical raised form, but may have a depressed form or any of various other forms.

The first conductivity type semiconductor layer 134A-1 is disposed on the support substrate 132. The first conductivity type semiconductor layer 134A-1 may be formed of a group III-V compound semiconductor, which is doped with a first conductive dopant. When the first conductivity type is an n-type, the first conductivity type semiconductor layer may include an n-type dopant, such as Si, Ge, Sn, Se, or Te, without being limited thereto.

For example, the first conductivity type semiconductor layer 134A-1 may include a semiconductor material having a composition of $Al_xIn_yGa_{(1-x-y)}N$, $0 \le y \le 1$, $0 \le x+y \le 1$). The first conductivity type semiconductor layer 134A-1 may be formed of one or more of GaN, InN, AlN, InGaN, AlGaN, InAlGaN, AlInN, AlGaAs, InGaAs, AlInGaAs, GaP, AlGaP, InGaP, AlInGaP, and InP.

The active layer 134A-2 is disposed on the first conductivity type semiconductor layer 134A-1. The active layer 134A-2 is a layer in which electrons introduced through the first conductivity type semiconductor layer 134A-1 and holes introduced through the second conductivity type semiconductor layer 134A-3 meet each other to discharge light having energy that is determined by the inherent energy band of a constituent material of the active layer 134A-2.

The active layer 134A-2 may have at least one of a single-well structure, a multi-well structure, a single-quantum well structure, a multi-quantum well (MQW) structure, a quantum wire structure, or a quantum dot structure.

The active layer 134A-2 may include a well layer and a barrier layer having a pair structure of one or more selected from among InGaN/GaN, InGaN/InGaN, GaN/AlGaN, InAlGaN/GaN, GaAs(InGaAs)/AlGaAs, and GaP(InGaP)/AlGaP, without being limited thereto. The well layer may be formed of a material having a band gap smaller than the band gap of the barrier layer.

A conductive clad layer (not illustrated) may further be formed above and/or under the active layer 134A-2. The conductive clad layer may be formed of a semiconductor having a band gap wider than the band gap of the barrier layer of the active layer 134A-2. For example, the conductive clad layer may include GaN, AlGaN, InAlGaN, a super-lattice structure, or the like. In addition, the conductive clad layer may be doped to an n-type or a p-type.

The second conductivity type semiconductor layer 134A-3 is disposed on the active layer 134A-2. The second conductivity type semiconductor layer 134A-3 may be formed of a semiconductor compound. The second conductivity type semiconductor layer 134A-3 may be formed of, for example, a group III-V or II-VI compound semiconductor. For example, the second conductivity type semiconductor layer 134A-3 may include a semiconductor material having a composition of $In_xAl_yGa_{1-x-y}N$ ($0 \le x \le 1$, $0 \le y \le 1$, $0 \le x+y \le 1$). When the second conductivity type is a p-type, the second conductivity type semiconductor layer 134A-3 may include a p-type dopant, such as Mg, Zn, Ca, Sr, or Ba.

The ohmic-contact layer 136 is disposed on the second conductivity type semiconductor layer 134A-3. When the second conductivity type semiconductor layer 134A-3 is a p-type semiconductor layer, the second conductivity type semiconductor layer 134A-3 may have high contact resistance due to a low doping concentration of dopant, and thus may have poor ohmic characteristics. Therefore, in order to improve such ohmic characteristics, the light emitting device 130A may further include the ohmic-contact layer 136. The ohmic-contact layer 136, disposed on the second conductivity type semiconductor layer 134A-3, may include at least one of a metal or a transparent conductive oxide (TCO) layer. For example, the ohmic-contact layer 136 may have a thickness of about 200 Å, and may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, or Hf, but is not limited to these materials.

In FIGS. 1 to 3, the light emitting device 130A is illustrated as being disposed above the first lead frame 122, but the embodiment is not limited thereto. That is, according to another embodiment, the light emitting device 130A may be disposed above the second lead frame 124.

In addition, as described above, since the first conductivity type semiconductor layer 134A-1 is electrically connected to the first lead frame 122 via the support substrate 132, there is no need to provide a wire. That is, the support substrate 132 may serve as a first electrode. On the other hand, the second conductivity type semiconductor layer 134A-3 may be electrically connected to the second lead frame 124 by the first wire 162.

In FIGS. 1 to 3 and 7a, the first wire 162 is illustrated as being directly connected to the second conductivity type semiconductor layer 134A-3, but the embodiment is not limited thereto. That is, according to another embodiment, the first wire 162 may be electrically connected to the second conductivity type semiconductor layer 134A-3 via the ohmic-contact layer 136. In this case, the ohmic-contact layer 136 may serve as a second electrode.

Next, the light emitting device 130B having a horizontal bonding structure illustrated in FIG. 7b may include a substrate 131, the light-emitting structure 134B, and first and second electrodes 135 and 137.

The substrate 131 may include a conductive material or a non-conductive material. For example, the substrate 131 may include at least one of sapphire ($Al_2O_3$), GaN, SiC, ZnO, GaP, InP, $Ga_2O_3$, GaAs, or Si.

For example, when the substrate 131 is a silicon substrate, it may include a (111) crystal plane as a primary plane. A silicon substrate is easily formed to have a large diameter and has excellent thermal conductivity, but may cause, for example, generation of cracks in the light-emitting structure 134B due to the difference in the coefficient of thermal expansion and lattice-mismatching between silicon and the nitride-based light-emitting structure 134B.

In order to prevent this, a buffer layer (or a transition layer) (not illustrated) may be disposed between the substrate 131 and the light-emitting structure 134B. The buffer layer may include at least one material selected from the group consisting of Al, In, N and Ga, for example, without being limited thereto. In addition, the buffer layer may have a single-layer or multilayer structure.

The first conductivity type semiconductor layer 134B-1 is disposed on the substrate 131. The first conductivity type semiconductor layer 134B-1 may be formed of a group III-V or II-VI compound semiconductor, which is doped with a first conductive dopant, and may be doped with a first conductivity type dopant. When the first conductivity type semiconductor layer 134B-1 is an n-type semiconductor layer, the first conductivity type dopant may be an n-type dopant, such as Si, Ge, Sn, Se, or Te, without being limited thereto.

For example, the first conductivity type semiconductor layer 134B-1 may include a semiconductor material having a composition of $Al_xIn_yGa_{(1-x-y)}N$ ($0 \le x \le 1$, $0 \le y \le 1$, $0 \le x+y \le 1$). The first conductivity type semiconductor layer 134B-1 may be formed of one or more of GaN, InN, AlN, InGaN, AlGaN, InAlGaN, AlInN, AlGaAs, InGaAs, AlInGaAs, GaP, AlGaP, InGaP, AlInGaP, and InP.

The active layer 134B-2 is disposed on the first conductivity type semiconductor layer 134B-1. The active layer 134B-2 is a layer in which electrons (or holes) introduced through the first conductivity type semiconductor layer 134B-1 and holes (or electrons) introduced through the second conductivity type semiconductor layer 134B-3 meet each other to discharge light having energy that is determined by the inherent energy band of a constituent material of the active layer 134B-2.

The active layer 134B-2 may have at least one of a single-well structure, a multi-well structure, a single-quantum well structure, a multi-quantum well (MQW) structure, a quantum wire structure, or a quantum dot structure.

The active layer 134B-2 may include a well layer and a barrier layer having a pair structure of one or more selected from among InGaN/GaN, InGaN/InGaN, GaN/AlGaN, InAlGaN/GaN, GaAs(InGaAs)/AlGaAs, and GaP(InGaP)/AlGaP, without being limited thereto. The well layer may be formed of a material having band gap energy lower than the band gap energy of the barrier layer.

A conductive clad layer (not illustrated) may further be formed above and/or below the active layer 134B-2. The conductive clad layer may be formed of a semiconductor having band gap energy higher than the band gap energy of the barrier layer of the active layer 134B-2. For example, the conductive clad layer may include GaN, AlGaN, InAlGaN, a super-lattice structure, or the like. In addition, the conductive clad layer may be doped to an n-type or a p-type.

The second conductivity type semiconductor layer 134B-3 is disposed on the active layer 134B-2. The second conductivity type semiconductor layer 134B-3 may be formed of a semiconductor compound, and for example, may be formed of a group III-V or II-VI compound semiconductor. For example, the second conductivity type semiconductor layer 134B-3 may include a semiconductor material having a composition of $In_xAl_yGa_{1-x-y}N$ ($0 \le x \le 1$, $0 \le y \le 1$, $0 \le x+y \le 1$). The second conductivity type semiconductor layer 134B-3 may be doped with a second conductivity type dopant. When the second conductivity type semiconductor layer 134B-3 is a p-type semiconductor layer, the second conductivity type dopant may include a p-type dopant, such as Mg, Zn, Ca, Sr, or Ba.

The first electrode 135 is disposed above the first conductivity type semiconductor layer 134B-1, which is exposed by mesa-etching the second conductivity type semiconductor layer 134B-3, the active layer 134B-2, and a portion of the first conductivity type semiconductor layer 134B-1. The second electrode 137 is disposed above the second conductivity type semiconductor layer 134B-3. For example, the first and second electrodes 135 and 137 may be formed using at least one of aluminum (Al), titanium (Ti), chrome (Cr), nickel (Ni), copper (Cu), or gold (Au) to have a single layer or multilayered structure.

When the first electrode 135 is electrically connected to the first lead frame 122 via a first wire 166, the first conductivity type semiconductor layer 134B-1 may be electrically connected to the first lead frame 122. In addition, when the second electrode 137 is electrically connected to the second lead frame 124 via a second wire 168, the second conductivity type semiconductor layer 134B-3 may be electrically connected to the second lead frame 124.

Next, the light emitting device 130C having a flip-chip bonding structure illustrated in FIG. 7c may include the substrate 131, the light-emitting structure 134C, the first electrode 135, and the second electrode 137.

The light-emitting structure 134C may be disposed below the substrate 131. The first conductivity type semiconductor layer 134C-1 is disposed below the substrate 131. The active layer 134C-2 is disposed below the first conductivity type semiconductor layer 134C-1. The second conductivity type semiconductor layer 134C-3 is disposed below the active layer 134C-2. The first electrode 135 is disposed below the first conductivity type semiconductor layer 134C-1. The second electrode 137 is disposed below the second conductivity type semiconductor layer 134C-3.

The substrate 131, the first conductivity type semiconductor layer 134C-1, the active layer 134C-2, the second conductivity type semiconductor layer 134C-3, the first electrode 135, and the second electrode 137 illustrated in FIG. 7c may perform the same role as and may be formed using the same material as each of the substrate 131, the first conductivity type semiconductor layer 134B-1, the active layer 134B-2, the second conductivity type semiconductor layer 134B-3, the first electrode 135, and the second electrode 137 illustrated in FIG. 7b. However, since the light emitting device 130B illustrated in FIG. 7b discharges light to the upper side and the lateral side, each of the second conductivity type semiconductor layer 134B-3 and the second electrode 137 may be formed using a light-transmitting material. Unlike this, since the light emitting device 130C illustrated in FIG. 7c discharges light to the upper side and the lateral side, each of the first conductivity type semiconductor layer 134C-1, the substrate 131, and the first electrode 135 may be formed using a light-transmitting material.

In the case of the light emitting device 1300 having a flip-chip bonding structure illustrated in FIG. 7c, the light emitting device package 1000A may further include first and second solder parts 139A and 139B.

The first solder part 139A is disposed between the first electrode 135 and the first lead frame 122. Thus, the first conductivity type semiconductor layer 134C-1 may be electrically connected to the first lead frame 122 via the first electrode 135 and the first solder part 139A. The second solder part 139B is disposed between the second electrode 137 and the second lead frame 124. Thus, the second conductivity type semiconductor layer 134C-3 may be electrically connected to the second lead frame 124 via the second electrode 137 and the second solder part 139B.

In each of the light-emitting structures 134A, 134B and 134C illustrated in FIGS. 7a to 7c, the first conductivity type semiconductor layer 134A-1, 134B-1 or 134C-1 may be a p-type semiconductor layer, and the second conductivity type semiconductor layer 134A-3, 134B-3 or 134C-3 may be an n-type semiconductor layer. Alternatively, the first conductivity type semiconductor layer 134A-1, 134B-1 or 134C-1 may be an n-type semiconductor layer, and the second conductivity type semiconductor layer 134A-3, 134B-3 or 134C-3 may be a p-type semiconductor layer.

The light-emitting structures 134A, 134B and 134C may have any one structure among an n-p junction structure, a p-n junction structure, an n-p-n junction structure, and a p-n-p junction structure.

Referring again to FIGS. 1 to 3, the molding member 140 may be disposed above the body 110 and the first and second lead frames 122 and 124 so as to surround the light emitting device 130. The molding member 140 may envelop and protect the light emitting device 130. In addition, the molding member 140 may include a fluorescent substance so as to convert the wavelength of light discharged from the light emitting device 130.

The molding member 140 may include first and second molding members 142 and 144.

The first molding member 142 may be disposed above the first and second lead frames 122 and 124 so as to surround the side portion of the light emitting device 130. The first molding member 142 serves to increase the luminous flux of light discharged from the light emitting device 130 and to prevent damage to the light emitting device 130 due to the external environment.

The second molding member 144 may be disposed above the first molding member 142 so as to surround the upper portion of the light emitting device 130. The second molding member 144 serves to secondarily increase the luminous flux of light discharged from the light emitting device 130. In addition, the first and third wires 162 and 164 illustrated in FIGS. 1 to 3 may not extend to the second molding member 144, but may be disposed only inside the first molding member 142. In some designs, each of the first wire 162 or 166, the second wire 168, and the third wire 164 may be disposed so as to extend to the inside of the second molding member 144 as well as the first molding member 142. In this case, the second molding member 144 may serve to protect each of the first wire 162 or 166, the second wire 168, and the third wire 164.

The molding member 140 may be formed of silicone. In this case, the first molding member 142 may be formed of white silicone and the second molding member 144 may be formed of clear silicone, but the embodiment is not limited to any specific material of the molding member 140.

The third thickness T3 of the first molding member 142 and the fourth thickness T4 of the light emitting device 130 may be the same as or different from each other. For example, as illustrated in FIG. 2, the third thickness T3 may be the same as the fourth thickness T4.

Meanwhile, the Zener diode 150 may be disposed on one of the first or second lead frame 122 or 124 on which the light emitting device 130 is not disposed. For example, as illustrated in FIGS. 1 to 3, when the light emitting device 130 has a vertical bonding structure and is disposed on the first lead frame 122, the Zener diode 150 may be disposed on the second lead frame 124. Here, the Zener diode 150 and the first lead frame 122 may be electrically connected to each other via the third wire 164.

Each of the first wire 162 or 166, the second wire 168, and the third wire 164 described above may be formed of gold (Au).

The Zener diode 150 serves to prevent overcurrent from flowing to the light emitting device package 1000A or electrostatic discharge (ESD) of an applied voltage.

In addition, the adhesive layer 152 may be disposed between the Zener diode 150 and the second lead frame 124. The adhesive layer 152 may serve to bond the Zener diode 150 to the second lead frame 124, may take the form of a paste, and may include silver (Ag) and epoxy.

In some cases, the light emitting device package 1000A may not include the Zener diode 150 and the adhesive layer 152, and the embodiment is not limited as to the presence or absence of the two 150 and 152 or the shape thereof.

FIG. 8 illustrates a cross-sectional view of the light emitting device package 1000B according to another embodiment.

The light emitting device package 1000B illustrated in FIG. 8 may include the body 110, the first and second lead frames 122 and 124, the light emitting device 130, the molding member 140, the Zener diode 150, the adhesive layer 152, the first and third wires 162 and 164, and a dam 170.

The light emitting device package 1000B illustrated in FIG. 8 is the same as the light emitting device package 1000A illustrated in FIG. 3, except that it further includes the dam 170. Thus, in the light emitting device package 1000B illustrated in FIG. 8, the same parts as those of the light emitting device package 1000A illustrated in FIG. 3 are denoted by the same reference numerals, and a redundant description thereof is omitted.

The dam 170 illustrated in FIG. 8 serves to confine the molding member 140, which is disposed above the first and second lead frames 122 and 124. That is, the molding member 140 may be disposed in a cavity, which is defined by the dam 170 and the top surfaces 122HT and 124HT of the first and second lead frames 122 and 124.

Hereinafter, a method of manufacturing the light emitting device package 1000A according to the embodiment illustrated in FIG. 3 will be described with reference to FIGS. 9a to 9d. However, needless to say, the light emitting device package 1000A according to the embodiment may be manufactured by a method different from the manufacturing method illustrated in FIGS. 9a to 9d. In addition, needless to say, the light emitting device package 1000B illustrated in FIG. 8 may also be manufactured by the method illustrated in FIGS. 9a to 9d, except that the dam 170 is further formed.

FIGS. 9a to 9d illustrate process cross-sectional views for explaining a method of manufacturing the light emitting device package 1000A according to the embodiment.

Referring to FIG. 9a, the body 110 and the first and second lead frames 122 and 124 are formed. Here, the body 110 may be manufactured using a black EMC, and each of the first and second lead frames 122 and 124 may be manufactured using copper (Cu).

For example, patterns of the first and second lead frames 122 and 124 are first formed by etching and stamping copper. Thereafter, the body 110 may be formed by injection molding the black EMC to the patterned first and second lead frames 122 and 124.

Subsequently, the light emitting device 130 is disposed on the first lead frame 122 via die bonding. For example, the light emitting device 130 may be formed as follows to have the structure illustrated in FIG. 7a.

The support substrate 132 is formed above the first lead frame 122, and the light-emitting structure 134A is formed above the support substrate 132. A first material layer for the first conductivity type semiconductor layer 134A-1, a second material layer for the active layer 134A-2, and a third material layer for the second conductivity type semiconductor layer 134A-3 are sequentially formed above the support substrate 132.

The first material layer may be formed of, for example, a group III-V or II-VI compound semiconductor, and for example, may include a semiconductor material having a composition of $In_xAl_yGa_{(1-x-y)}N$ ($0 \leq x \leq 1$, $0 \leq y \leq 1$, $0 \leq x+y \leq 1$) The second material layer may include a well layer and a barrier layer, which have a pair structure and are repeated, and a pair of the well layer and the barrier layer may include any one of InGaN/GaN, InGaN/InGaN, GaN/AlGaN, InAlGaN/GaN, GaAs(InGaAs)/AlGaAs, and GaP(InGaP)/AlGaP. The third material layer may be formed of, for example, a group III-V or II-VI compound semiconductor, and for example, may include a semiconductor material having a composition of $In_xAl_yGa_{1-x-y}N$ ($0 \leq x \leq 1$, $0 \leq y \leq 1$, $0 \leq x+y \leq 1$).

Subsequently, the light-emitting structure 134 may be formed by patterning the first to third material layers through a normal photolithography process. Subsequently, the ohmic-contact layer 136 is formed above the light-emitting structure 134.

Here, the adhesive layer 152 and the Zener diode 150 may be formed above the second lead frame 124 while the light emitting device 130 is formed.

Subsequently, referring to FIG. 9b, the light emitting device 130 is subjected to wire bonding. That is, the first wire 162 is formed to electrically connect the second conductivity type semiconductor layer 134A-3 of the light emitting device 130 to the second lead frame 124, and the third wire 164 is formed to electrically connect the Zener diode 150 to the first lead frame 122.

Subsequently, referring to FIG. 9c, a dam process of forming a dam 210 on the side portions of the first and second lead frames 122 and 124 and the body 110 so as to define the cavity in which the molding member 140 is accommodated is performed. The reason why the dam process is performed is to prevent the first and second molding members 142 and 144, which have relatively low viscosity that permits flowing, from flowing down before being cured.

Subsequently, as illustrated in FIG. 9d, a dispensing process is performed to fill the space, defined by the dam 210, the first and second lead frames 122 and 124, and the body 110, with the molding member 140. At this time, after the first molding member 142 is formed to the height of the light emitting device 130, the second molding member 144 is formed above the top surface of the light emitting device 130 and the first molding member 142. As described above, through the provision of the dam 210, it is possible to prevent the dispensed molding member 140 from flowing down before being cured.

Subsequently, when the dam 210 illustrated in FIG. 9d is removed, the light emitting device package 1000A illustrated in FIG. 3 may be completed. FIGS. 9a to 9d are process cross-sectional views illustrating the manufacture of one light emitting device package 1000A, but a plurality of light emitting device packages 1000A may be formed at the same time through the processes illustrated in FIGS. 9a to 9d. In this case, after the process illustrated in FIG. 9d, a dicing process may be performed to separate a single light emitting device package 1000A.

Hereinafter, the light emitting device packages 1000A and 1000B according to the embodiments, which include the body 110 formed of a black EMC, will be compared with a light emitting device package according to a comparative example, which includes a substrate formed of a white EMC, a ceramic such as polycyclohexylene dimethylene terephthalate (PCT), or AlN. In addition, although not illustrated, for convenience, the light emitting device package according to the comparative example is assumed to include a substrate instead of the body 110 in the light emitting device packages 1000A and 1000B according to the embodiments.

When the substrate is formed of a white EMC, a ceramic, or AlN as in the light emitting device package according to the comparative example, various problems may be caused.

For example, the manufacturing costs of the light emitting device packages 1000A and 1000B according to the embodiments are much lower than the manufacturing costs of the light emitting device package according to the comparative example. This is because the price of a ceramic or AlN is about 10 to 30 times more expensive than that of a black EMC.

In addition, when the light emitting device package according to the comparative example includes the substrate formed of PCT or a white EMC, the rigidity, injection molding ability, and processability of the light emitting device package may become unstable. On the other hand, the light emitting device packages 1000A and 1000B according to the embodiments may eliminate this problem because the body 110 is formed of a black EMC.

In addition, a black EMC or a white EMC includes particles, and the particles included in a black EMC are smaller than the particles included in a white EMC. Thus, when the body 110 is manufactured using a black EMC as in the light emitting device packages 1000A and 1000B according to the embodiments, the degree of integration of the first and second lead frames 122 and 124 may be increased, which may increase the number of light emitting device packages that may be manufactured per unit time. Moreover, when the particles are smaller, the light emitting device packages 1000A and 1000B may enable an increase in the freedom of design, that is, an increased variety of shapes.

In addition, in the light emitting device package according to the comparative example, thermal resistance from the light emitting device 130 to the first and second lead frames 122 and 124 is 7.5° C./W. In comparison, when the body 110 is formed of a black EMC according to the embodiment, thermal resistance from the light emitting device 130 to the lower end of the first and second lead frames 122 and 124 (the lower surface of the layer 122L or the lower surface of the layer 124L) has a relatively small value of 5° C./W. Thus, under the same power, the light emitting device packages 1000A and 1000B including the body 110 formed of a black EMC have higher thermal conductivity and better heat dissipation than the light emitting device package according to the comparative example having the substrate which is formed of ceramic or AlN.

In addition, when the substrate is formed of a white EMC or a ceramic as in the light emitting device package according to the comparative example, cracks may form in the substrate, and dust may be generated during a manufacturing process, which may have an adverse effect on the performance of the light emitting device package. However, when the body 110 is formed of a black EMC as in the light emitting device packages according to the embodiments, the generation of cracks and dust may be prevented.

In addition, in the light emitting device package according to the comparative example, since the substrate is formed of, for example, a resin, the substrate may have a cup shape, and the top surface thereof may not have a flat cross-sectional shape. When the substrate is formed of a ceramic, the top surface of the substrate may have a flat cross-sectional shape, but, as described above, a ceramic has various problems compared to a black EMC. On the other hand, the light emitting device packages 1000A and 1000B according to the embodiments may be reduced in price by using a black EMC, which has a price lower than that of a ceramic, and the top surface 110T of the body 110 may be flat, as illustrated in FIG. 6.

Hereinafter, the light emitting device packages 1000C and 1000D according to other embodiments will be described with reference to the accompanying drawings.

FIG. 10 illustrates a top assembled perspective view of the light emitting device package 1000C according to still another embodiment, FIG. 11 illustrates a top exploded perspective view of the light emitting device package 1000C illustrated in FIG. 10, FIG. 12 illustrates a bottom exploded perspective view of the light emitting device package 1000C illustrated in FIG. 10, FIG. 13 illustrates a plan view of the light emitting device package 1000C illustrated in FIG. 10, FIG. 14 illustrates a bottom view of the light emitting device package 1000C illustrated in FIG. 10, FIG. 15 illustrates a top partially assembled perspective view of the light emitting device package 1000C illustrated in FIG. 10, and FIGS. 16 and 17 illustrate cross-sectional views of the light emitting device package 1000C illustrated in FIG. 10.

Referring to FIGS. 10 to 17, the light emitting device package 1000C according to still another embodiment may include first and second lead frames 1112 and 1114, light sources 1122 and 1124, a Zener diode 1126, first to fourth wires 1132 to 1138, an inner body 1140A, an outer body 1150A, a molding member 1160, and an upper structure 1170. In FIGS. 10 to 15, the illustration of the molding member 1160 and the upper structure 1170 is omitted.

The inner body 1140A may electrically separate the first and second lead frames 1112 and 1114 from each other, and may define a cavity C together with the first and second lead frames 1112 and 1114.

In addition, the inner body 1140A may include a lower portion 1140AL and a side portion 1140AS. Here, the lower portion 1140AL of the inner body 1140A serves to electrically separate the first and second lead frames 1112 and 1114 from each other. To this end, the lower portion 1140AL of the inner body 1140A may be disposed between the first and second lead frames 1112 and 1114. The side portion 1140AS of the inner body 1140A may extend from the lower portion 1140AL to form the side surface of the cavity C.

When the side portion 1140AS of the inner body 1140A has a slope, the light discharged from the light sources 1122 and 1124 may be reflected by the slope so as to be directed upwards, which may increase light extraction efficiency.

FIG. 18 illustrates a top assembled perspective view of the light emitting device package 1000D according to a further embodiment, and FIG. 19 illustrates a top partially assembled perspective view of the light emitting device package 1000D illustrated in FIG. 18.

The inner body 1140A or 1140B may further include a reflective protrusion 1140AP or 1140BP, which penetrates the top surface of the outer body 1150A or 1150B. For example, as illustrated in FIGS. 10 to 15, the reflective protrusion 1140AP may protrude outwards in the first direction (e.g. the x direction) of the light emitting device package 1000C so as to divide the top surface of the outer body 1150A into two. Alternatively, as illustrated in FIGS. 18 and 19, the reflective protrusion 1140BP may protrude outwards in the second directions (e.g. the x direction and the y direction) so as to divide the top surface of the outer body 1150B into four. However, the embodiments are not limited thereto. That is, in other embodiments, the inner body 1140A or 1140B may divide the top surface of the outer body 1150A or 1150B into three, or into five or more.

The reflective protrusions 1140AP and 1140BP illustrated in FIGS. 10 to 19 may have a symmetrical planar shape. That is, the reflective protrusion 1140AP illustrated in FIGS. 10 to 15 may have a symmetrical planar shape in the x direction, and the reflective protrusion 1140BP illustrated in FIGS. 18 and 19 may have a symmetrical planar shape in both the x direction and the y direction.

The light emitting device package 1000D illustrated in FIGS. 18 and 19 is the same as the light emitting device package 1000C illustrated in FIGS. 10 to 17, except for the difference between the reflective protrusion 1140AP illustrated in FIGS. 10 to 15 and the reflective protrusion 1140BP thereof. Thus, hereinafter, the description related to the light emitting device package 1000C illustrated in FIGS. 10 to 17 may be equally applied to the light emitting device package 1000D illustrated in FIGS. 18 and 19.

The lower portion 1140AL of the inner body 1140A may include a plurality of through-holes. As illustrated, the lower portion 1140AL of the inner body 1140A may include first to third through-holes TH1, TH2 and TH3.

The first and second lead frames 1112 and 1114, as described above, may be electrically separated from each other by the inner body 1140A. The first and second lead frames 1112 and 1114 serve to supply a voltage to the light sources 1122 and 1124. In addition, the first and second lead frames 1112 and 1114 may serve to reflect light generated from the light sources 1122 and 1124 so as to increase luminous efficacy, and may also serve to outwardly dissipate heat generated from the light sources 1122 and 1124.

The first lead frame 1112 may include a first lower lead frame 1112B and a first upper lead frame 1112T. The first lower lead frame 1112B may be inserted into and disposed in some (e.g., the first through-hole TH1) of the plurality of through-holes. The first upper lead frame 1112T may be disposed above the first lower lead frame 1112B, and may form a portion of the bottom surface of the cavity C.

In addition, the first lower lead frame 1112B and the first upper lead frame 1112T may be separate from each other, as illustrated, or may be integrated, unlike the illustration.

Unlike the first lower lead frame 1112B inserted into the first through-hole TH1, the first upper lead frame 1112T may not be inserted into the first through-hole TH1, but the embodiment is not limited thereto. The first upper lead frame 1112T may have a planar area wider than that of the first lower lead frame 1112B, but the embodiment is not limited thereto.

In addition, the second lead frame 1114 may include a second lower lead frame 1114B and a second upper lead frame 1114T. The second lower lead frame 1114B may be inserted into and disposed in the remaining ones of the plurality of through-holes (e.g., the second and third through-holes TH2 and TH3). In particular, referring to FIG. 12, the second lower lead frame 1114B may include a second-first lower lead frame 1114B1 and a second-second lower lead frame 1114B2, which are separate from each other. The second-first lower lead frame 1114B1 may be inserted into and disposed in the second through-hole TH2, and the second-second lower lead frame 1114B2 may be inserted into and disposed in the third through-hole TH3. However, the embodiment is not limited thereto. According to another embodiment, unlike the illustration of FIG. 12, there may be one second lower lead frame 1114B. That is, the second-first and second-second lower lead frames 1114B1 and 1114B2 may be integrated. When the second-first and second-second lower lead frames 1114B1 and 1114B2 are integrated, the integrated second lower lead frame 1114B may be inserted into and disposed in an integrated through-hole (not illustrated) of the second and third through-holes TH2 and TH3.

The second upper lead frame 1114T may be disposed above the second lower lead frame 1114B, and may form the remaining portion of the bottom surface of the cavity C.

In addition, the second lower lead frame 1114B and the second upper lead frame 1114T may be separate from each other, as illustrated, or may be integrated, unlike the illustration.

Unlike the second-first and second-second lower lead frames 1114B1 and 1114B2 inserted respectively into the second and third through-holes TH2 and TH3, the second upper lead frame 1114T may not be inserted into the second and third through-holes TH2 and TH3, but the embodiment is not limited thereto. The second upper lead frame 1114T may have a planar area wider than that of the second lower lead frame 1114B, but the embodiment is not limited thereto.

Referring to FIG. 15, the first upper lead frame 1112T, the second upper lead frame 1114T, and the lower portion 1140AL of the inner body 1140A may form the same horizontal surface, which corresponds to the bottom surface of the cavity C.

Each of the first and second lead frames 1112 and 1114 may be formed of an electrically conductive material, but the embodiment is not limited to any specific material of the first and second lead frames 1112 and 1114. Each of the first and second lead frames 1112 and 1114 may include at least one of copper (Cu), nickel (Ni), silver (Ag), or gold (Au). For example, each of the first and second lead frames 1112 and 1114 may be formed by forming the base of each of the first and second lead frames 1112 and 1114 using copper (Cu), and by primarily performing strike plating on a rough portion of the base using copper (Cu) or nickel (Ni) and then performing main plating thereon using silver (Ag) or gold (Au). Here, strike plating means the process of filling valleys with copper (Cu) or nickel (Ni) when the surface of the base of the first and second lead frames 1112 and 1114 is a rough surface in which valleys and ridges are alternately repeated.

Here, the first lower lead frame 1112B and the second lower lead frame 1114B may be mounted on a printed circuit board (not illustrated), which is disposed below the light emitting device package 1000C.

The light sources 1122 and 1124 may be disposed on at least one of the first or second lead frame 1112 or 1114 inside the cavity C.

Here, the light sources 1122 and 1124 may be light-emitting diodes (LEDs) or laser diodes (LDs), and the embodiment is not limited as to the shape of the light sources 1122 and 1124. Here, the light sources 1122 and 1124 correspond to the light emitting device 130 (130A, 130B or 130C) of the above-described embodiment.

In addition, in FIGS. 10 to 19, two light sources 1122 and 1124 are illustrated, but the embodiment is not limited as to the number of light sources 1122 and 1124. That is, according to another embodiment, only one light source may be disposed, or three or more light sources may be disposed.

As illustrated in FIGS. 10 to 19, each of the light sources 1122 and 1124 may have a horizontal bonding structure, but the embodiment is not limited thereto. That is, according to another embodiment, each of the light sources 1122 and 1124 may have a vertical bonding structure or a flip-chip bonding structure.

In FIGS. 1 to 19, the light sources 1122 and 1124 are illustrated as being disposed on the second lead frame 1114, but the embodiment is not limited thereto. That is, according to another embodiment, the light sources 1122 and 1124 may be disposed on the first lead frame 1112.

FIGS. 20a to 20c illustrate cross-sectional views of various embodiments 1200A, 1200B and 1200C of each of the light sources 1122 and 1124 included in the light emitting device packages 1000C and 1000D according to the embodiments.

Each of the light sources 1122 and 1124 illustrated in FIGS. 10 to 19 may have a horizontal bonding structure, as illustrated in FIG. 20a. However, according to another embodiment, each of the light sources 1122 and 1124 may have a vertical bonding structure, as illustrated in FIG. 20b, or may have a flip-chip bonding structure, as illustrated in FIG. 20c.

Each of the light sources 1200A, 1200B and 1200C illustrated in FIGS. 20a to 20c may include a light-emitting structure 1220A, 1250 or 1220B.

Regardless of the difference in bonding structure, the light-emitting structure 1220A, 1250 or 1220B may include a first conductivity type semiconductor layer 1222A, 1252 or 1222B, an active layer 1224A, 1254 or 1224B, and a second conductivity type semiconductor layer 1226A, 1256 or 1226B. The light-emitting structures 1220A, 1250 and 1220B may be formed of the same material or different materials. This will be described below.

The light source 1200A having a horizontal bonding structure illustrated in FIG. 20a is the same as the light emitting device 130B having a horizontal bonding structure illustrated in FIG. 7b, and thus a redundant description thereof is omitted. That is, a substrate 1210A, the light-emitting structure 1220A, and first and second electrodes 1232A and 1234A illustrated in FIG. 20a respectively correspond to the substrate 131, the light-emitting structure 134B, and the first and second electrodes 135 and 137 illustrated in FIG. 7b.

When the light source 1200A illustrated in FIG. 20a corresponds to the light source 1122, the first conductivity type semiconductor layer 1222A may be electrically connected to the first lead frame 1112 by electrically connecting the first electrode 1232A to the first lead frame 1112 via a wire 1242. In this case, the wire 1242 may correspond to the first wire 1132 illustrated in FIGS. 10 to 19.

Alternatively, when the light source 1200A illustrated in FIG. 20a corresponds to the light source 1124, the first conductivity type semiconductor layer 1222A may be electrically connected to the other light source 1122 by electrically connecting the first electrode 1232A to the light source 1122 adjacent thereto via the wire 1242. In this case, the wire 1242 may correspond to the second wire 1134 illustrated in FIGS. 10 to 19.

In addition, when the light source 1200A illustrated in FIG. 20a corresponds to the light source 1122, the second conductivity type semiconductor layer 1226A may be electrically connected to the other light source 1124 by electrically connecting the second electrode 1234A to the light source 1124 adjacent thereto via a wire 1244. In this case, the wire 1244 may correspond to the second wire 1134 illustrated in FIGS. 10 to 19.

Alternatively, when the light source 1200A illustrated in FIG. 20a corresponds to the light source 1124, the second conductivity type semiconductor layer 1226A may be electrically connected to the second lead frame 1114 by electrically connecting the second electrode 1234A to the second lead frame 1114 via the wire 1244. Here, the second wire 1244 may correspond to the third wire 1136 illustrated in FIGS. 10 to 19.

Although not illustrated, an ohmic-contact layer (not illustrated) may further be disposed between the second conductivity type semiconductor layer 1226A and the second electrode 1234A. When the second conductivity type semiconductor layer 1226A is a p-type semiconductor layer, the second conductivity type semiconductor layer may have high contact resistance due to a low doping concentration of dopant, and thus may have poor ohmic characteristics. Therefore, in order to improve such ohmic characteristics, the ohmic-contact layer may further be disposed. The thickness and material of the ohmic-contact layer are the same as the thickness and material of the ohmic-contact layer 136 illustrated in FIG. 7a, and thus a redundant description thereof is omitted.

Next, the light source 1200B having a vertical bonding structure illustrated in FIG. 20b may include a support substrate 1240, the light-emitting structure 1250, and the first electrode 1260. The support substrate 1240 and the light-emitting structure 1250 illustrated in FIG. 20b respectively correspond to the support substrate 132 and the light-emitting structure 134A of the light emitting device 130A illustrated in FIG. 7a, and thus a redundant description of the same parts is omitted.

When the light source 1200B is disposed on the second lead frame 1114, the second conductivity type semiconductor layer 1256 is electrically connected to the second lead frame 1114 via the support substrate 1240. However, when the light source 1200B is disposed on the first lead frame 1112, the second conductivity type semiconductor layer 1256 may be electrically connected to the first lead frame 1112 via the support substrate 1240.

The second conductivity type semiconductor layer 1256 is disposed on the support substrate 1240. The second conductivity type semiconductor layer 1256 may be formed of a semiconductor compound. The second conductivity type semiconductor layer 1256 may be formed of, for example, a group III-V or II-VI compound semiconductor, and may include, for example, a semiconductor material having a composition of $In_xAl_yGa_{1-x-y}N$ ($0 \leq x \leq 1$, $0 \leq y \leq 1$, $0 \leq x+y \leq 1$). When the second conductivity type is a p-type, the second conductivity type semiconductor layer 1256 may include a p-type dopant, such as Mg, Zn, Ca, Sr, or Ba.

The active layer 1254 is the same as the active layer 134A-2 illustrated in FIG. 7a, and thus a redundant description thereof is omitted.

The first conductivity type semiconductor layer 1252 is disposed above the active layer 1254. The first conductivity type semiconductor layer 1252 may be formed of a group III-V compound semiconductor, which is doped with a first conductivity dopant. When the first conductivity type is an n-type, the first conductivity type semiconductor layer 1252 may include an n-type dopant, such as Si, Ge, Sn, Se or Te, without being limited thereto.

The first conductivity type semiconductor layer 1252 may include, for example, a semiconductor material having a composition of $In_xAl_yGa_{(1-x-y)}N$ ($0 \leq x \leq 1$, $0 \leq y \leq 1$, $0 \leq x+y \leq 1$). The first conductivity type semiconductor layer 1252 may be formed of one or more of GaN, InN, AlN, InGaN, AlGaN, InAlGaN, AlInN, AlGaAs, InGaAs, AlInGaAs, GaP, AlGaP, InGaP, AlInGaP, and InP.

The first electrode 1260 is disposed on the first conductivity type semiconductor layer 1252. As described above, since the second conductivity type semiconductor layer 1256 is electrically connected to the second lead frame 1114 via the support substrate 1240, there is no need to provide a wire. On the other hand, the first conductivity type semiconductor layer 1252 may be electrically connected to the first lead frame 1112 via a wire 1272, which is connected to the first electrode 1260.

Next, the light source 1200C having a flip-chip bonding structure illustrated in FIG. 20c may include a substrate 1210B, the light-emitting structure 1220B, a first electrode 1232B, and a second electrode 1234B.

The substrate 1210B, the light-emitting structure 1220B, the first electrode 1232B, the second electrode 1234B, a first solder part 1282, and a second solder part 1284 illustrated in FIG. 20c respectively correspond to the substrate 131, the light-emitting structure 134C, the first electrode 135, the second electrode 137, the first solder part 139A, and the second solder part 139B illustrated in FIG. 7c, and thus a redundant description thereof is omitted.

In each of the light-emitting structures 1220A, 1250 and 1220B illustrated in FIGS. 20a to 20c, the first conductivity type semiconductor layer 1222A, 1252 or 1222B may be an n-type semiconductor layer, and the second conductivity type semiconductor layer 1226A, 1256 or 1226B may be a p-type semiconductor layer. Alternatively, the first conductivity type semiconductor layer 1222A, 1252 or 1222B may be a p-type semiconductor layer, and the second conductivity type semiconductor layer 1226A, 1256 or 1226B may be an n-type semiconductor layer.

The light-emitting structures 1220A, 1250 and 1220B may have any one structure among an n-p junction structure, a p-n junction structure, an n-p-n junction structure, and a p-n-p junction structure.

Referring again to FIGS. 10 to 19, the outer body 1150A or 1150B may be disposed so as to surround the outer side surface of the inner body 1140A or 1140B.

The inner body 1140A or 1140B and the outer body 1150A or 1150B may have a symmetrical planar shape. For example, referring to FIG. 13, the horizontal length L1 and the vertical length L2 of the light emitting device package 1000C may be the same. When a square planar shape is embodied, in which the horizontal length L1 and the vertical length L2 are the same, there is a reduced possibility of cracking in the outer periphery P of the light emitting device package 1000C, compared to when a rectangular planar shape is embodied, in which the horizontal length L1 and the vertical length L2 are different. In addition, the side portion 1140AS of the inner body 1140A may include one or more inner fastening holes IH1 and IH2, and the outer body 1150A may include one or more outer fastening holes OH1, OH2, OH3 and OH4, which communicate with the inner fastening holes IH1 and IH2.

The inner fastening holes IH1 and IH2 may be spaced apart from each other by a constant distance, and the outer fastening holes OH1, OH2, OH3 and OH4 may be spaced apart from each other by a constant distance.

The first lead frame 1112 may include first fastening protrusions 1112P, and the second lead frame 1114 may include second fastening protrusions 1114P. The first and second fastening protrusions 1112P and 1114P may protrude outwards in the third direction (e.g. the y direction) toward the inner body 1140A and the outer body 1150A.

The first fastening protrusions 1112P of the first lead frame 1112 may be buried in the inner fastening hole IH1 and the outer fastening hole OH1, and the second fastening protrusions 1114P of the second lead frame 1114 may be buried in the inner fastening hole IH2 and the outer fastening holes OH2, OH3 and OH4, so as to fasten the inner body 1140A and the outer body 1150A to each other.

In the embodiment, the number of first fastening protrusions 1112P is two, the number of second fastening protrusions 1114P is four, and the inner fastening holes IH1 and IH2 and the outer fastening holes OH1, OH2, OH3 and OH4 are provided in the same number as that of the fastening protrusions 1112P and 1114P. However, the embodiment is not limited as to the numbers of the elements 1112P, 1114P, IH1, IH2, OH1, OH2, OH3 and OH4.

Referring to FIGS. 16 and 17, the molding member 1160 may be buried in the cavity C so as to surround the light sources 1122 and 1124 and the Zener diode 1126. The molding member 1160 serves to increase the luminous flux of light discharged from the light sources 1122 and 1124 and to prevent damage to the light sources 1122 and 1124 and the Zener diode 1126 due to the external environment. In addition, the molding member 1160 may serve to protect the first to fourth wires 1132 to 1138. The molding member 1160 may be formed of silicone. For example, the molding member 1160 may take the form of a stack of white silicone and clear silicone, but the embodiment is not limited as to a specific structure or material of the molding member 1160. In addition, the molding member 1160 may include a wavelength conversion material (e.g., a fluorescent substance or a phosphorescent substance) for converting the wavelength of light discharged from the light sources 1122 and 1124.

In addition, the Zener diode 1126 may be disposed above at least one of the first or second lead frame 1112 or 1114. For example, in FIGS. 10 to 19, the Zener diode 1126 is illustrated as being disposed above the first lead frame 1112, but the embodiment is not limited thereto. That is, according to another embodiment, the Zener diode 1126 may be disposed above the second lead frame 1114. Here, the Zener diode 1126 and the first lead frame 1112 may be electrically connected to each other via the fourth wire 1138. Each of the above-described first to fourth wires 1132 to 1138 may be formed of gold (Au).

The Zener diode 1126 serves to prevent overcurrent from flowing to the light emitting device packages 1000C and 1000D or electrostatic discharge (ESD) of an applied voltage.

In addition, an adhesive layer (not illustrate) may be disposed between the Zener diode 1126 and the first lead frame 1112. The adhesive layer may serve to bond the Zener diode 1126 to the first lead frame 1112, may take the form of a paste, and may include silver (Ag) and epoxy.

In some cases, the light emitting device packages 1000C and 1000D may not include the Zener diode 1126 and the adhesive layer, and the embodiment is not limited as to the presence or absence of the Zener diode 1126 and the adhesive layer or the shape thereof.

Referring to FIGS. 16 and 17 in succession, the upper structure 1170 may be disposed so as to cover the cavity C. Here, the upper structure 1170 may correspond to a diffuser or a lens. In some cases, the upper structure 1170 may be omitted.

When the upper structure 1170 is disposed as illustrated in FIGS. 16 and 17, the light discharged from the light sources 1122 and 1124 may be reflected by the upper structure 1170, and may then be directed to the inner body 1140A or 1140B and to the outer body 1150A or 1150B. In this case, in the case in which the inner body 1140A or 1140B is formed of a white EMC, a greater amount of light may be reflected and light extraction efficiency may be further increased when four reflective protrusions 1140BP are disposed, as illustrated in FIGS. 18 and 19, compared to the case in which two reflective protrusions 1140AP are provided as illustrated in FIGS. 10 to 17. This is because the number of reflective protrusions formed of a white EMC is greater in the light emitting device package 1000D illustrated in FIGS. 18 and 19 than in the light emitting device package 1000C illustrated in FIGS. 1 to 15.

In addition, the outer body 1150A or 1150B and the inner body 1140A or 1140B may be formed of different materials. For example, since the inner body 1140A or 1140B is disposed close to the light sources 1122 and 1124 and defines the cavity C, it may be formed of a material having excellent reflectivity, rather than being formed of a material having excellent rigidity. On the other hand, since the outer body 1150A or 1150B is disposed at the outer periphery of the light emitting device package 1000C or 1000D, it may be formed of a material having excellent rigidity, rather than being formed of a material having excellent reflectivity.

For example, each of the inner body 1140A or 1140B and the outer body 1150A or 1150B may include an epoxy molding compound (EMC). For example, the inner body 1140A or 1140B may include a white EMC, and the outer body 1150A or 1150B may include a black EMC. In addition, the inner body 1140A or 1140B and the outer body 1150A or 1150B may be coupled to each other by injection molding.

Hereinafter, the manufacturing process of the light emitting device package 1000C or 1000D according to the embodiment will be described in brief.

First, an etching process of etching, for example, copper and a stamping process of patterning the base of the first and second lead frames 1112 and 1114 using a punch are performed.

Subsequently, a process of plating the patterned base of the first and second lead frames 1112 and 1114 is performed. In the plating process, strike plating and main plating, described above, may be performed.

Subsequently, the inner body 1140A or 1140B may be formed by injection molding a white EMC using a primary mold, and the outer body 1150A or 1150B may be formed by injection molding a black EMC using a secondary mold, so that the inner body 1140A or 1140B and the outer body 1150A or 1150B are coupled to each other.

Subsequently, the light sources 1122 and 1124 and the first to third wires 1132 to 1136 are formed above the second lead frame 1114. While the light sources 1122 and 1124 and the first to third wires 1132 to 1136 are formed, the Zener diode 1126 may be formed above the first lead frame 1112, and the fourth wire 1138 may be formed between the Zener diode 1126 and the second lead frame 1114 through a wire bonding process.

Subsequently, a dispensing process of filling the cavity C with the molding member 1160 may be performed.

When a plurality of light emitting device packages is formed at the same time through the above-described processes, individual light emitting device packages 1000C and 1000D may be formed by performing a dicing process.

In addition, each of a white EMC and a black EMC may include an epoxy resin, a hardener, and a filler. For example, the volume of the filler included in the white EMC relative to the weight percent may be 76/83 (vol/wt %), and the volume of the filler included in the black EMC relative to the weight percent may be 84/74 (vol/wt %).

In addition, the white EMC has light reflectivity superior to that of the black EMC, and the black EMC has higher rigidity than the white EMC. For example, the breaking strengths of the white EMC and the black EMC may be as set forth in the following Table 1.

TABLE 1

| Classification | Black EMC | | White EMC | |
| --- | --- | --- | --- | --- |
| Breaking Strength | Minimum Value (MIN) | 2.66 | Minimum Value (MIN) | 1.31 |
| | Maximum Value (MAX) | 4.57 | Maximum Value (MAX) | 1.77 |
| | Average Value (Avg) | 3.24 | Average Value (Avg) | 1.56 |

Referring to Table 1, it can be appreciated that the breaking strength of a black EMC is approximately two times or more of the breaking strength of a white EMC.

Therefore, when the inner body 1140A or 1140B, which defines the cavity C in which the light sources 1122 and 1124 are disposed, is formed of a white EMC, light extraction ability may be improved, compared to when the inner body 1140A or 1140B is formed of a black EMC.

In addition, referring to FIG. 13, the outer periphery P of the light emitting device package 1000C or 1000D is susceptible to cracking.

Therefore, when the outer periphery P of the light emitting device package 1000C or 1000D is formed of a black EMC having rigidity higher than that of a white EMC, the rigidity of the light emitting device package 1000C or 1000D may be improved compared to when the outer body 1150A or 1150B is formed of a white EMC, which may prevent cracking at the crack generation point P.

The above-described light emitting device package 1000C or 1000D may have excellent light extraction efficiency and high rigidity by dividing the body into the inner body 1140A or 1140B and the outer body 1150A or 1150B, by forming the inner body 1140A or 1140B using a white EMC, which has reflectivity higher than that of a black EMC, and by forming the outer body 1150A or 1150B using a black EMC, which has rigidity higher than that of a white EMC.

Unless explicitly stated otherwise, a description related to any one embodiment of the light emitting device packages 1000A, 1000B, 1000C and 1000D according to the above-described embodiments may be applied to the other embodiments. That is, unless there is a special conflicting description, a description related to the embodiments 1000A and 1000B may also be applied to the other embodiments 1000C and 1000D, and a description related to the embodiments 1000C and 1000D may also be applied to the other embodiments 1000A and 1000B.

In the case of the light emitting device packages 1000A, 1000B, 1000C and 1000D according to the embodiments, a plurality of light emitting device packages may be arranged on a board, and optical members, such as a light guide plate, a prism sheet, and a diffuser sheet may be disposed on the optical path of the light emitting device packages 1000A, 1000B, 1000C and 1000D. The light emitting device packages 1000A, 1000B, 1000C and 1000D, the board, and the optical members may function as a backlight unit.

In addition, the light emitting device packages 1000A, 1000B, 1000C and 1000D according to the embodiments may be applied to a display apparatus, an indicator apparatus, and a lighting apparatus.

Here, the display apparatus may include a bottom cover, a reflector disposed on the bottom cover, a light-emitting module for emitting light, a light guide plate disposed in front of the reflector to guide light emitted from the light-emitting module forwards, an optical sheet including prism sheets disposed in front of the light guide plate, a display panel disposed in front of the optical sheet, an image signal output circuit connected to the display panel to supply an image signal to the display panel, and a color filter disposed in front of the display panel. Here, the bottom cover, the reflector, the light-emitting module, the light guide plate, and the optical sheet may form a backlight unit.

In addition, the lighting apparatus may include a light source module including a board and the light emitting device package 1000A, 1000B, 1000C or 1000D according to the embodiment, a radiator configured to dissipate heat of the light source module, and a power supply unit configured to process or convert an electrical signal received from the outside and provide the same to the light source module. For example, the lighting apparatus may include a lamp, a headlamp, or a street light.

The headlamp may include a light-emitting module including a plurality of light emitting device packages 1000A, 1000B, 1000C or 1000D disposed on a board, a reflector configured to reflect light emitted from the light-emitting module in a given direction, for example, in the forward direction, a lens configured to refract the light reflected by the reflector forwards, and a shade configured to block or reflect some of the light, which has been reflected by the reflector to thereby be directed to the lens, so as to realize the light distribution pattern desired by a designer.

The above description merely describes the technical sprit of the embodiments by way of example, and various modifications and substitutions related to the above description are possible by those skilled in the art without departing from the scope and spirit of the disclosure. Accordingly, the disclosed embodiments are provided for the purpose of description and are not intended to limit the technical scope of the disclosure, and the technical scope of the disclosure is not limited by the embodiments. The range of the disclosure should be interpreted based on the following claims, and all technical ideas that fall within the range equivalent to the claims should be understood as belonging to the scope of the disclosure.

MODE FOR INVENTION

Modes for the implementation of embodiments have sufficiently been described in the "best mode" described above.

INDUSTRIAL APPLICABILITY

A light emitting device package according to the embodiments may be used in a display apparatus, an indicator apparatus, and a lighting apparatus.

The invention claimed is:

1. A light emitting device package comprising;
a body comprising a black epoxy molding compound (EMC) containing carbon black;
first and second lead frames electrically separated from each other by the body;
a light emitting device disposed above at least one of the first lead frame or the second lead frame; and
a molding member disposed above the body and the first and second lead frames so as to surround the light emitting device,
wherein the first lead frame comprises:
a first-first layer; and
a first-second layer disposed above the first-first layer, the first-second layer being wider than the first-first layer,
wherein the second lead frame comprises:
a second-first layer; and
a second-second layer disposed above the second-first layer, the second-second layer being wider than the second-first layer,
wherein the body comprises:
a first-first accommodation space in which the first-first layer is accommodated;
a second-first accommodation space in which the second-first layer is accommodated;
a partition disposed so as to separate the first-first accommodation space and the second-first accommodation space from each other;
a first-second accommodation space, in which the first-second layer is accommodated, and which is located above the first-first accommodation space; and
a second-second accommodation space, in which the second-second layer is accommodated, and which is located above the second-first accommodation space,
wherein the first-second layer comprises at least one first protrusion configured to protrude outwards from the first-second accommodation space,
wherein the second-second layer comprises at least one second protrusion configured to protrude outwards from the second-second accommodation space, and
wherein the body comprises a plurality of blind holes configured to accommodate therein the first and second protrusions.

2. The package according to claim 1, wherein a top surface of the body and a top surface of each of the first and second lead frames are located on a single horizontal plane, and
wherein the top surface of the body and the top surface of each of the first and second lead frames have a flat shape.

3. The package according to claim 1, wherein thermal resistance from the light emitting device to a lower end of the first and second lead frames is 5° C./W.

4. The package according to claim 1, wherein the light emitting device comprises a light-emitting structure, and
wherein the light-emitting structure comprises:
a first conductivity type semiconductor layer;
an active layer disposed above the first conductivity type semiconductor layer; and
a second conductivity type semiconductor layer disposed above the active layer.

5. The package according to claim 4, further comprising a first wire configured to electrically connect the second conductivity type semiconductor layer to the second lead frame,
wherein the first conductivity type semiconductor layer is electrically connected to the first lead frame.

6. The package according to claim 1, wherein the light emitting device comprises a light-emitting structure,
wherein the light-emitting structure comprises:
a first conductivity type semiconductor layer;
an active layer disposed below the first conductivity type semiconductor layer; and
a second conductivity type semiconductor layer disposed below the active layer, and
wherein the light emitting device further comprises:
a substrate disposed above the light-emitting structure;
a first electrode disposed below the first conductivity type semiconductor layer; and
a second electrode disposed below the second conductivity type semiconductor layer.

7. The package according to claim 1, wherein the body comprises:
an inner body configured to electrically separate the first and second lead frames from each other and defining a cavity together with the first and second lead frames; and
an outer body configured to surround an outer side surface of the inner body and formed of a material different from that of the inner body, and
wherein the light emitting device is disposed in the cavity.

8. The package according to claim 7, wherein each of the inner body and the outer body comprises an EMC, the inner body comprises a white EMC, and the outer body comprises the black EMC.

9. The package according to claim 7, wherein the inner body comprises:
a lower portion configured to electrically separate the first and second lead frames from each other; and
a side portion configured to extend from the lower portion so as to form a side surface of the cavity,
wherein the inner body further comprises a reflective protrusion configured to penetrate an upper surface of the outer body, and
wherein the reflective protrusion divides the upper surface of the outer body into two or four.

10. The package according to claim 9, wherein the reflective protrusion has a symmetrical planar shape.

11. The package according to claim 9, wherein the lower portion of the inner body includes a plurality of through-holes,
wherein the first lead frame comprises:
a first lower lead frame inserted into and disposed in some of the through-holes; and
a first upper lead frame disposed above the first lower lead frame and defining a portion of a bottom surface of the cavity, and
wherein the second lead frame comprises:
a second lower lead frame inserted into and disposed in the remaining through-holes; and
a second upper lead frame disposed above the second lower lead frame and defining a remaining portion of the bottom surface of the cavity.

12. The package according to claim 11, wherein the first lower lead frame and the first upper lead frame are integrated, and
wherein the second lower lead frame and the second upper lead frame are integrated.

13. The package according to claim 11, wherein the first upper lead frame, the second upper lead frame, and the lower portion of the inner body forms a single horizontal plane corresponding to the bottom surface of the cavity.

14. The package according to claim 7, wherein a side portion of the inner body includes at least one inner fastening hole, wherein the outer body includes at least one outer fastening hole, which communicates with the inner fastening hole, and wherein each of the first and second lead frames includes a fastening protrusion configured to be buried in the inner fastening hole and the outer fastening hole so as to fasten the inner body and the outer body to each other.

15. The package according to claim 14, wherein the at least one inner fastening hole includes a plurality of inner fastening holes spaced apart from each other by a constant distance, and wherein the at least one outer fastening hole includes a plurality of outer fastening holes spaced apart from each other by a constant distance.

16. The package according to claim 7, wherein the inner body and the outer body have a symmetrical planar shape.

17. The package according to claim 1, wherein the molding member comprises:

a first molding member configured to surround a side portion of the light emitting device and disposed above the first and second lead frames; and a second molding member configured to surround an upper portion of the light emitting device and disposed above the first molding member.

18. The package according to claim 1, wherein a thickness of the body is the same as a thickness of the first and second lead frames.

19. The package according to claim 7, further comprising an upper structure disposed so as to cover the cavity.

20. A lighting apparatus comprising the light emitting device package according to claim 1.

* * * * *